US011581254B2

(12) United States Patent
Yang et al.

(10) Patent No.: US 11,581,254 B2
(45) Date of Patent: Feb. 14, 2023

(54) THREE DIMENSIONAL MIM CAPACITOR HAVING A COMB STRUCTURE AND METHODS OF MAKING THE SAME

(71) Applicant: Taiwan Semiconductor Manufacturing Company Limited, Hsinchu (TW)

(72) Inventors: Paul Yang, Hsinchu (TW); Tsun-Kai Tsao, Tainan (TW); Sheng-Chau Chen, Tainan (TW); Sheng-Chan Li, Tainan (TW); Cheng-Yuan Tsai, Chu-Pei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 60 days.

(21) Appl. No.: 17/069,083

(22) Filed: Oct. 13, 2020

(65) Prior Publication Data

US 2022/0115317 A1    Apr. 14, 2022

(51) Int. Cl.
*H01L 23/522* (2006.01)
*H01L 21/768* (2006.01)
*H01L 23/532* (2006.01)
*H01L 49/02* (2006.01)

(52) U.S. Cl.
CPC .... *H01L 23/5223* (2013.01); *H01L 21/76831* (2013.01); *H01L 21/76879* (2013.01); *H01L 23/53266* (2013.01); *H01L 28/56* (2013.01)

(58) Field of Classification Search
CPC ........... H01L 23/5223; H01L 23/53266; H01L 21/76831; H01L 21/76879; H01L 28/56
USPC ........................ 257/532; 438/386, 387, 389
See application file for complete search history.

(56) References Cited

U.S. PATENT DOCUMENTS

| | | | |
|---|---|---|---|
| 2010/0038750 A1* | 2/2010 | Collins | H01L 29/66181 257/532 |
| 2014/0197519 A1* | 7/2014 | Choi | H01L 28/92 716/103 |
| 2018/0350896 A1* | 12/2018 | Chung | H01L 28/60 |

OTHER PUBLICATIONS

Taiwan Patent and Trademark Office, Application No. 109142997 Office Action, dated Apr. 26, 2022 5 pages.

* cited by examiner

*Primary Examiner* — Quoc D Hoang
(74) *Attorney, Agent, or Firm* — Thw Marbury Law Group, PLLC

(57) ABSTRACT

Metal-insulator-metal (MIM) capacitor, an integrated semiconductor device having a MIM capacitor and methods of making. The MIM capacitor includes a first metal layer, a second metal layer and a dielectric layer located between the second metal layer and the first metal layer. The first metal layer, the second metal layer and the dielectric layer may be formed in a comb structure, wherein the comb structure include a first tine structure and at least a second tine structure.

20 Claims, 40 Drawing Sheets

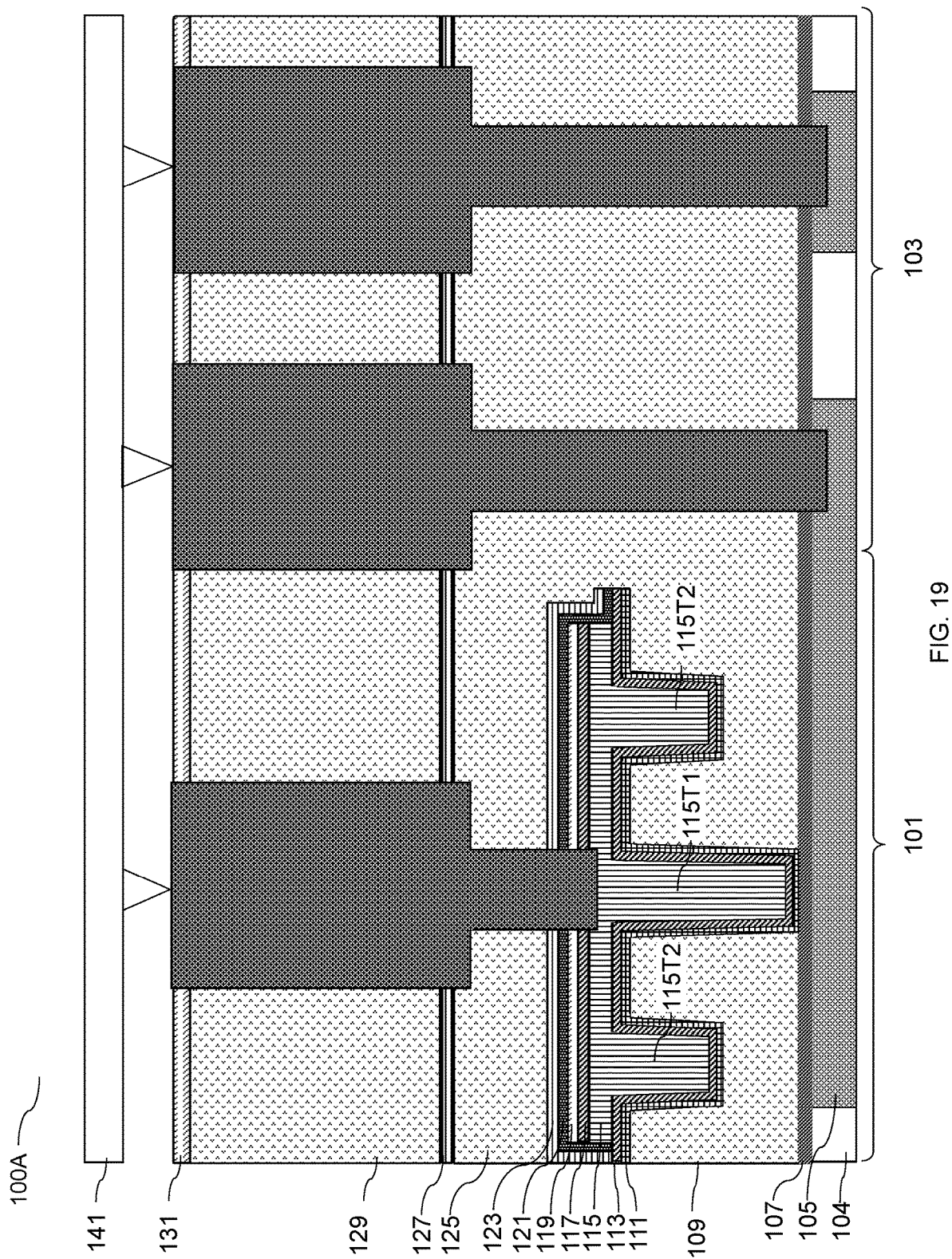

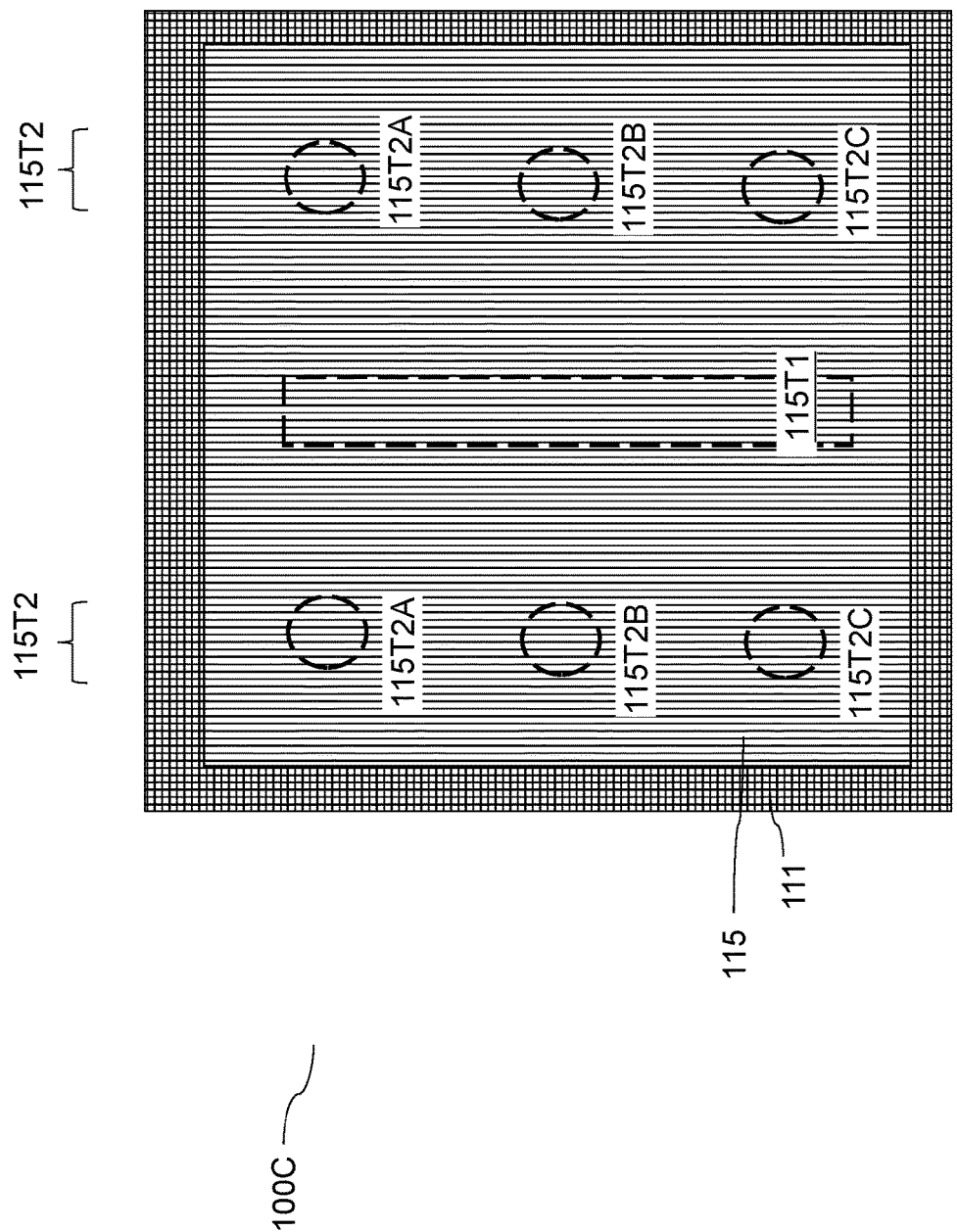

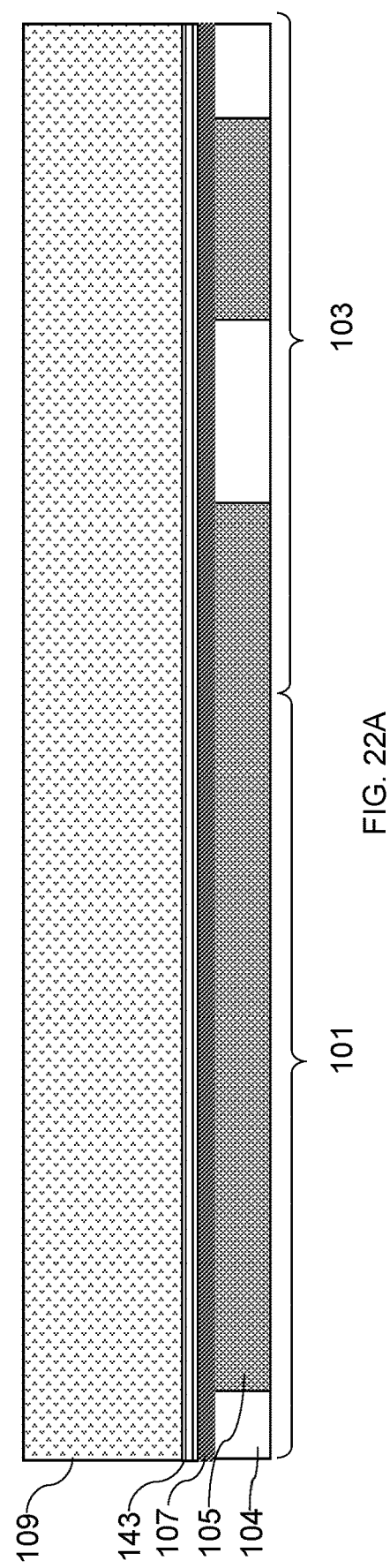

THREE DIMENSIONAL MIM CAPACITOR HAVING A COMB STRUCTURE AND METHODS OF MAKING THE SAME

BACKGROUND

In general, a capacitor includes two conductive electrodes on opposing sides of a dielectric or other dielectric layer, and may be categorized based on the materials employed to form the capacitor. For example, in a metal-insulator-metal (MIM) capacitor, as its name suggests the electrodes substantially comprise metallic materials and an insulator may comprise the dielectric layer. MIM capacitors are advantageous in that they possess a relatively constant value of capacitance over a relatively wide range of voltages applied thereto. MIM capacitors also exhibit a relatively small parasitic resistance.

In integrated circuit designs, on-chip capacitors are used in various applications including dynamic random access memories (DRAM), voltage controlled oscillators (VCO), phase-lock loops, operational amplifiers and other circuit designs. On-chip capacitors are also used to decouple circuits from noise in a separate portion of an electrical system.

Further, in a method of making three dimensional circuits, two dies, each including respective integrated circuits, may be disposed to opposing surfaces of an interposer. An interposer includes a substrate through which a through-substrate-via (TSV) structure may be formed. A dielectric layer may formed over the TSV structure. A copper bulk which may be wider than the TSV structure may then be formed in the dielectric layer and in contact with the TSV structure. Then, an etch stop layer may be formed on the dielectric layer. To provide a charge storage, a MIM capacitor may be formed on the etch stop layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 is a vertical cross-sectional view illustrating testing the device illustrated in FIG. 18 with a test probe according to an embodiment of the present disclosure.

FIG. 20C is a top down view illustrating a MIM capacitor according to an embodiment of the present disclosure.

FIG. 22A is a vertical cross-sectional view illustrating forming a first etch stop layer, a second etch stop layer and a dielectric layer over a metal line according to another embodiment of the present disclosure.

DETAILED DESCRIPTION

Figure 1:
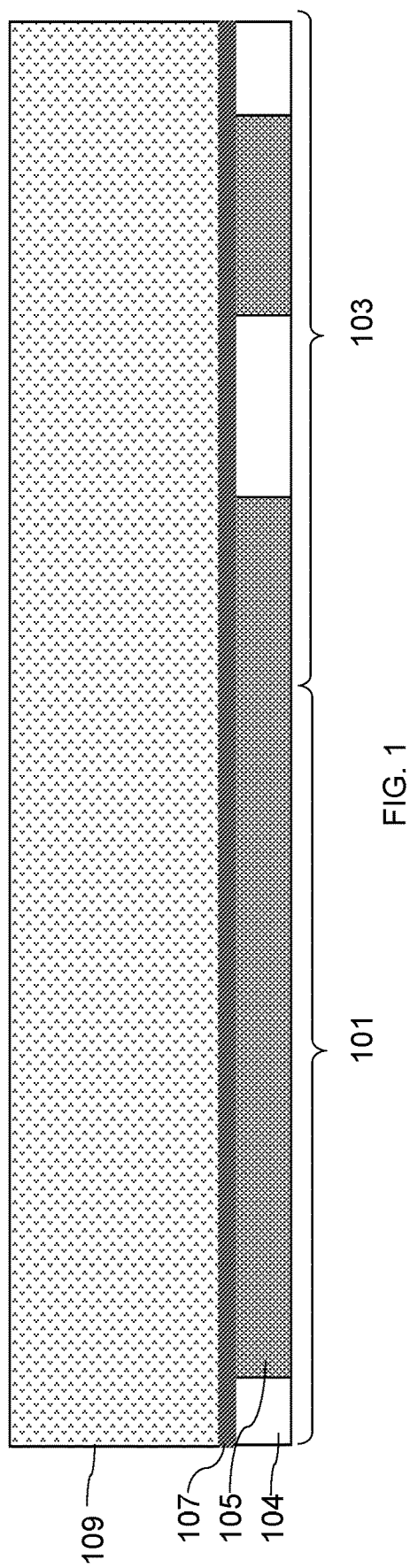
FIG. 1 is a vertical cross-sectional view illustrating forming a first etch stop layer and a dielectric layer over a metal line according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to semiconductor devices with metal-insulator-metal (MIM) capacitors. The capacitors are advantageous in that they possess a relatively constant value of capacitance over a relatively wide range of voltages applied thereto. MIM capacitors also exhibit a relatively small parasitic resistance. In integrated circuit designs, on-chip capacitors may be used in various applications including dynamic random access memories (DRAM), voltage controlled oscillators (VCO), phase-lock loops, operational amplifiers and other circuit designs. On-chip capacitors may also be used to decouple circuits from noise in a separate portion of an electrical system.

Increases in the capacitance of a capacitor are desired as such increased capacitance may improve performance. Capacitance may be expressed in farads as $$C = \frac{\varepsilon A}{d},$$

where $\varepsilon$ is the permittivity of the dielectric material (absolute, not relative), A is the area of plate overlap in square meters, and d is the distance between plates in meters. Thus, as the area of the plate overlap increases, the capacitance may also increase in a direct relationship. Therefore, one solution to increase capacitance is to increase the area of the metal plates. However, in the context of semiconductor device fabrication, increasing the area of the plates reduces areal density of the devices that may ultimately be fabricated on a substrate.

Various embodiments are disclosed herein that provide for the fabrication of MIM capacitors with a comb structure. In this manner, the various embodiments disclosed herein may fabricate a MIM capacitor that provides an increase of the effective area without increasing the footprint of the capacitor. Thus, a higher capacitance may be achieved without reducing the areal density of the capacitors. Capacitance may be increased 1.1× to 3× or more for the same footprint and materials relative to a parallel plate capacitor. Further, the capacitance may be tuned by adjusting the number of tines and the height of the tines. Such embodiment high capacitance 3D-MIM may provide the necessary capacitance to be utilized in a CMOS image sensor (CIS) global shutter. In digital photography applications, global shutters are desired to provide distortion free images of moving images.

Referring to FIG. 1-30, methods of fabricating various embodiment MIM devices are presented. Referring to FIG. 1, a first etch stop layer 107 may be deposited over metal line 105, such as a metal line 105 formed in an interposer. The metal line 105 may also be located or embedded in an interlayer dielectric level (IDL) layer 104 in the interposer or in a dielectric layer in a back-end-of-the-line (BEOL) portion of an integrated semiconductor device. Next, a dielectric layer 109 may be deposited over first etch stop layer 107. The metal line 105 may be made of any suitable material such as, but not limited to, Ti, Ta, W, Cu, Co, Mo, Ru, TiN, TaN and WN. The first etch stop layer 107 may be made of any suitable material. In various embodiments, the first etch stop layer 107 may be made of SiC. Further, the first etch stop layer 107 may have a thickness in the range of 250-750 Å, such as 400-600 Å. The dielectric layer 109 may be made of any suitable material. In various embodiments, the dielectric layer 109 may be made of a plasma enhanced oxide (PEOX), such as $SiO_2$ made by a plasma enhance oxidation process. Further, the dielectric layer 109 may have a thickness in the range of 1000-5000 Å, such as 2000-4000 Å. As illustrated, in an embodiment, the MIM capacitors may be fabricated in a first, capacitor region 101 of an integrated semiconductor device having a first, capacitor region 101 and a second, logic region 103. Other device configurations may be fabricated as well.

Figure 2:
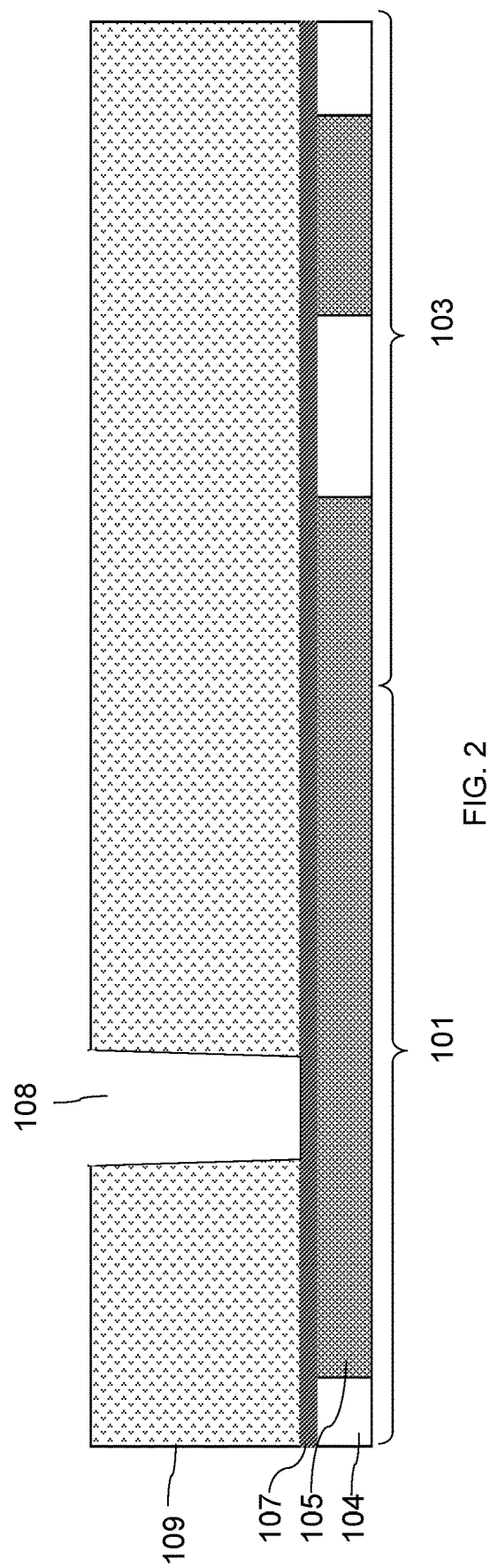
FIG. 2 is a vertical cross-sectional view illustrating etching a first trench in the dielectric layer according to an embodiment of the present disclosure.

Referring to FIG. 2, a first trench 108 may be formed in the dielectric layer 109. The first trench 108 may be formed by depositing, patterning a photoresist layer (not shown) and patterning the dielectric layer 109. In various embodiments, dielectric layer 109 may be etched until the etch process reaches the first etch stop layer 107. The first trench 108 may have a width in the range of 0.12-0.2 µm, such as 0.14-0.18 µm, although wider or narrower trenches may be formed. In various embodiments, the sidewalls of the first trench 108 may slope inward such that the bottom of the first trench 108 is narrower than the top of the first trench 108. When the etch process is complete, the photoresist layer may be removed, such as by ashing or dissolving in a solvent.

Figure 3:
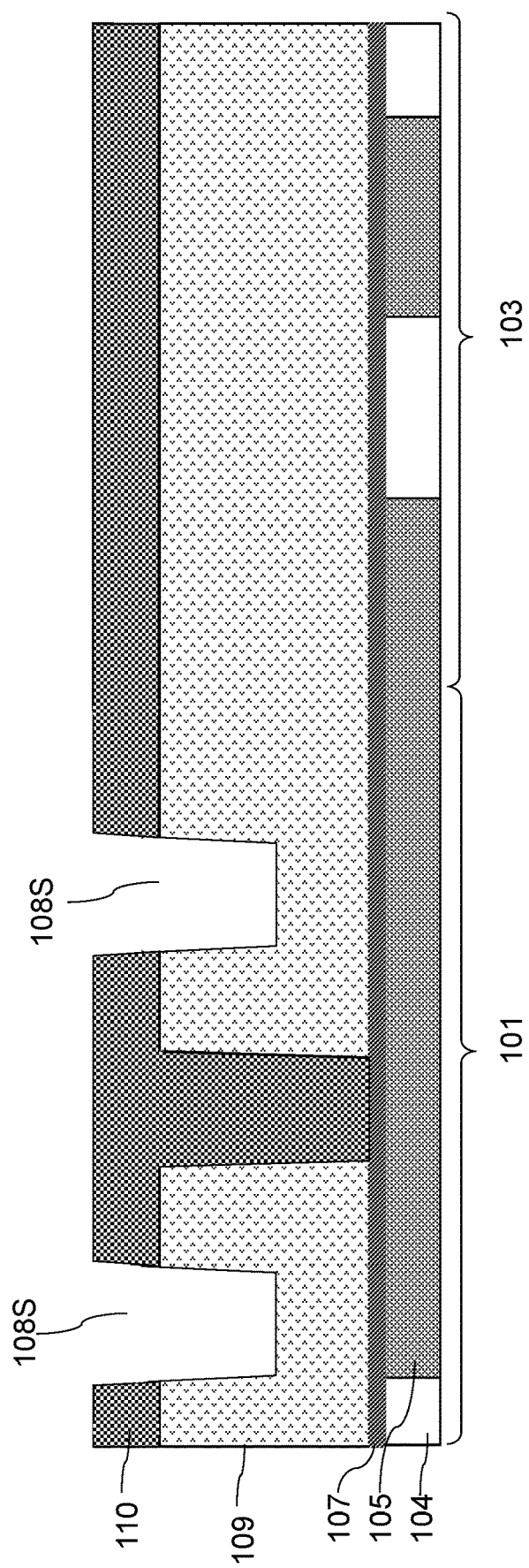
FIG. 3 is a vertical cross-sectional view illustrating forming second trenches according to an embodiment of the present disclosure.

Referring to FIG. 3, a photoresist layer 110 may be deposited over the intermediate structure illustrated in FIG. 2. In various embodiments, the photoresist layer 110 may fill the first trench 108. The photoresist layer 110 may then be patterned such that one or more portions of the surface of the dielectric layer 109 are exposed. The exposed portions of the dielectric layer 109 may be etched to form one or more second trenches 108S. In various embodiments, the second trenches 108S are shallower than the first trench 108. In various embodiments, the depth of the second trenches 108S may be in the range of 0.25-0.75 times the depth of the first trench 108, such as 0.4-0.6 times the depth of the first trench 108. The second trenches 108S may have a width in the range of 0.12-0.2 µm, such as 0.14-0.18 µm, although wider or narrower trenches may be formed. Similar to the first trenches 108, the sidewalls of the second trenches 108S may slope inwardly such that the bottom of the second trenches 108S are narrower than the top of the second trenches 108S. Etching may be performed by wet etching or dry etching.

Figure 4:
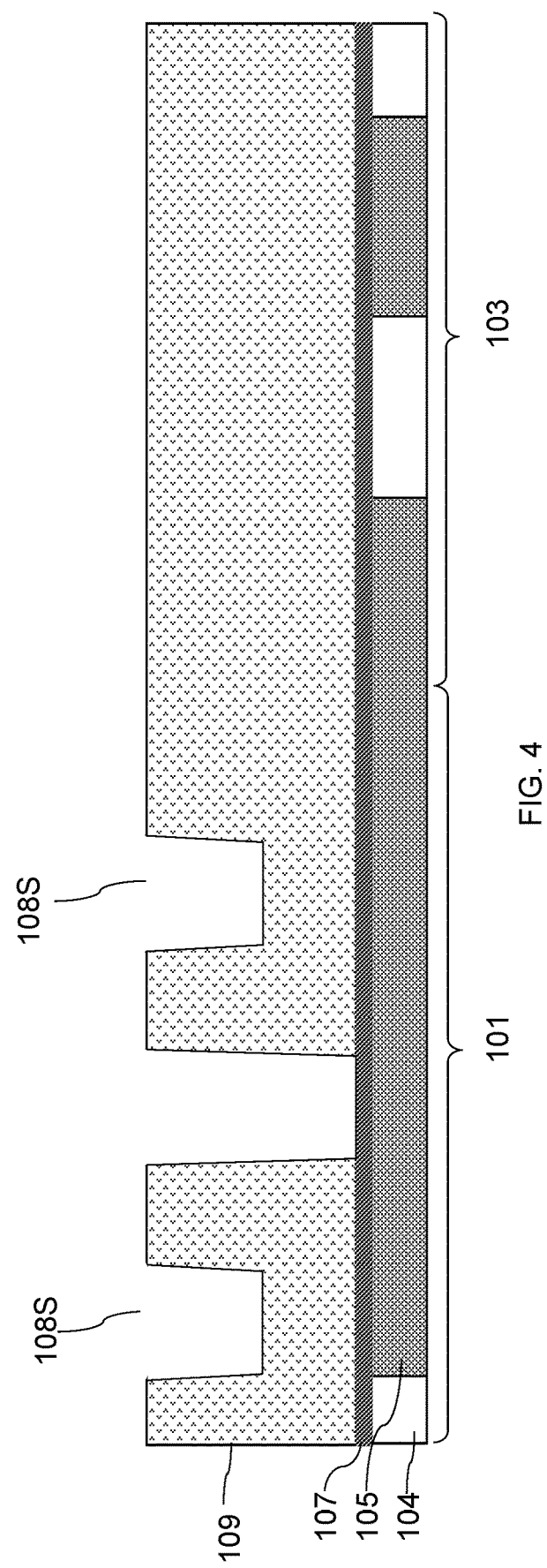
FIG. 4 is a vertical cross-sectional view illustrating removing photoresist from the intermediate structure illustrated in FIG. 3 according to an embodiment of the present disclosure.

Referring to FIG. 4, the photoresist layer 110 may be removed by ashing or dissolving in a solvent. As illustrated in FIG. 4, the first trench 108 may be deeper than the second trenches 108S. Further, as illustrated, two second trenches 108S are illustrated. However, any number of second trenches may be formed, such as 1-10, 2-8, 4-6.

Figure 5:
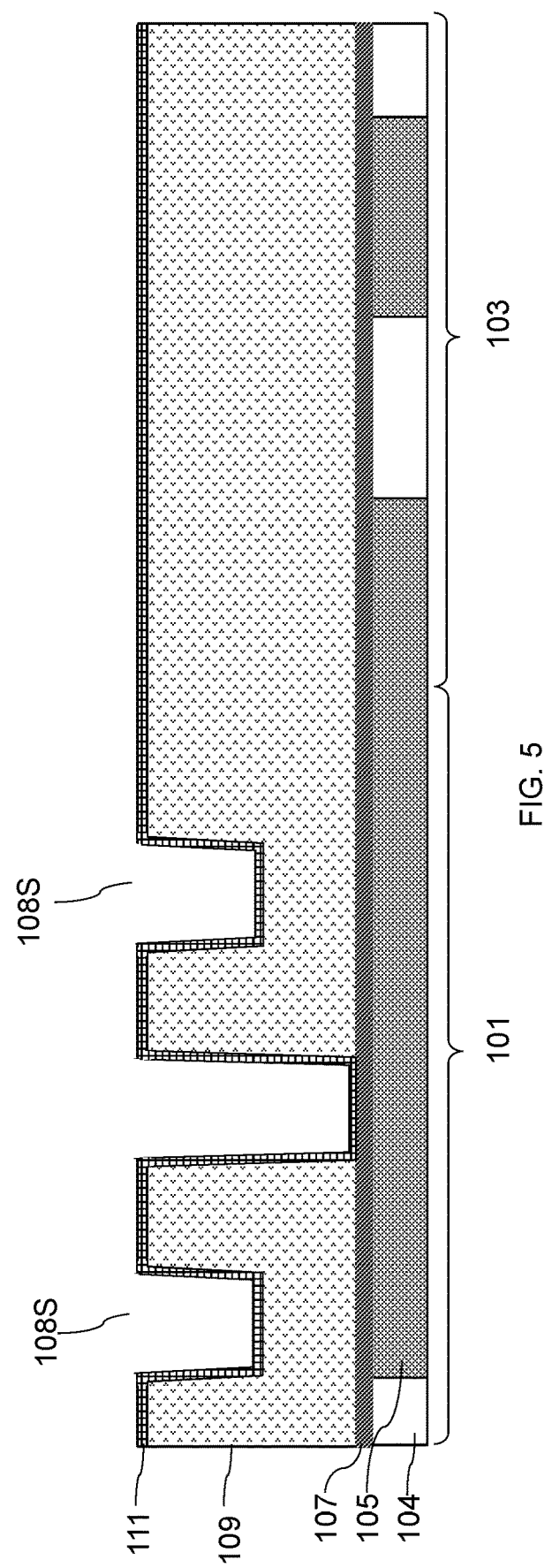
FIG. 5 is a vertical cross-sectional view illustrating forming a metal barrier layer over the intermediate structure illustrated in FIG. 4 according to an embodiment of the present disclosure.

Referring to FIG. 5, a metal barrier layer 111 may be conformally deposited over the exposed surfaces of the dielectric layer 109 and the first etch stop layer 107 at the bottom of the first trench 108. The metal barrier layer 111 may be made of multiple layers of conductive materials, such as a TaN/Ta/TiN metal barrier layer. Other suitable metal barrier layer materials are within the contemplated scope of disclosure. Because the metal barrier layer 111 may be made of conductive materials, the metal barrier layer 111 acts as the first metal plate of the MIM capacitor. The metal barrier layer 111 may also prevent dopants from diffusing from lower device layers into the MIM capacitor. The metal barrier layer 111 may be formed by chemical vapor deposition (CVD), plasma enhanced chemical vapor deposition (PECVD), atomic layer deposition (ALD) or any other suitable method. In various embodiments, the metal barrier layer 111 may have a thickness in the range of 300-600 Å, such as 400-500 Å. For example, for a TaN/Ta/TiN metal barrier layer 111, the TaN layer may be in the range of 10-50 Å, the Ta layer may be in the range of 100-200 Å and the TiN layer may be in the range of 150-350 Å, although thicker or thinner layers of the metal barrier layer 111 may be formed.

Figure 6:
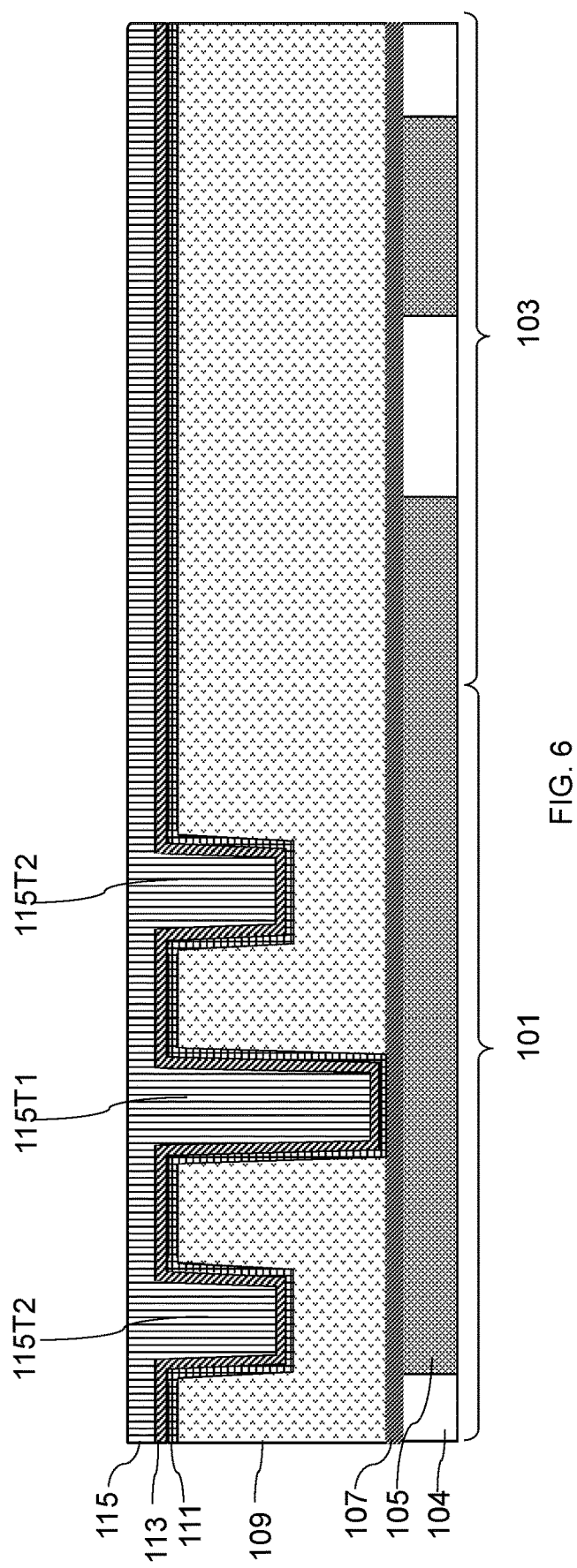
FIG. 6 is a vertical cross-sectional view illustrating forming a high k dielectric layer, and a metal layer over the intermediate structure illustrated in FIG. 5 according to an embodiment of the present disclosure.

Referring to FIG. 6, a high k dielectric layer 113 may be conformally formed on the metal barrier layer 111. In various embodiments, the high k dielectric layer 113 may be made of $ZrO_2$—$Al_2O_3$—$ZrO_2$ (ZAZ). Other suitable high k dielectric materials include $TiO_2$, $TaOx$, $HfO_2$, $Al_2O_3$, $Ta_2O_5$, $ZrO_2$ and $TiO_2$. In various embodiments, the high k dielectric layer 113 may have a thickness in a range of 15-100 Å, such as 50-75 Å. For example, if the high k dielectric layer 113 is made of ZAZ, the $ZrO_2$ may be in the range of 10-30 Å, the $Al_2O_3$ may be in the range of 10-30 Å and the $ZrO_2$ may be in the range of 10-30 Å, although thicker or thinner layers of the high-k dielectric layer 113 may be formed. The high k dielectric layer 113 may be formed by chemical vapor deposition (CVD), plasma enhanced chemical vapor deposition (PECVD), atomic layer deposition (ALD) or any other suitable method.

Next a metal layer 115 may be deposited. In various embodiments, the metal layer 115 may comprise a metal or metallic material such as W, Cu, Co, Mo, Ru, Ta, TiN, TaN, and/or WN. In various embodiments, the metal layer 115 may be deposited until the metal material completely fills the remaining space in the first trench 108 and the second trenches 108S. In this manner, a first tine 115T1 may be formed in the first trench 108. In addition, second tines 115T2 may be formed in the second trenches 108S, thereby forming a comb structure. In various embodiments, the first tine 115T1 is longer the second tines 115T2. In an embodiment, the top surface of the intermediate structure illustrated in FIG. 6 may be planarized, such as by a chemical-mechanical polishing (CMP) process. In various embodiments, after planarization, the metal layer 115 may have a thickness in the range of 300-500 Å, such as 350-450 Å, although thicker or thinner layers of the metal material 115 may be formed.

Figure 7:
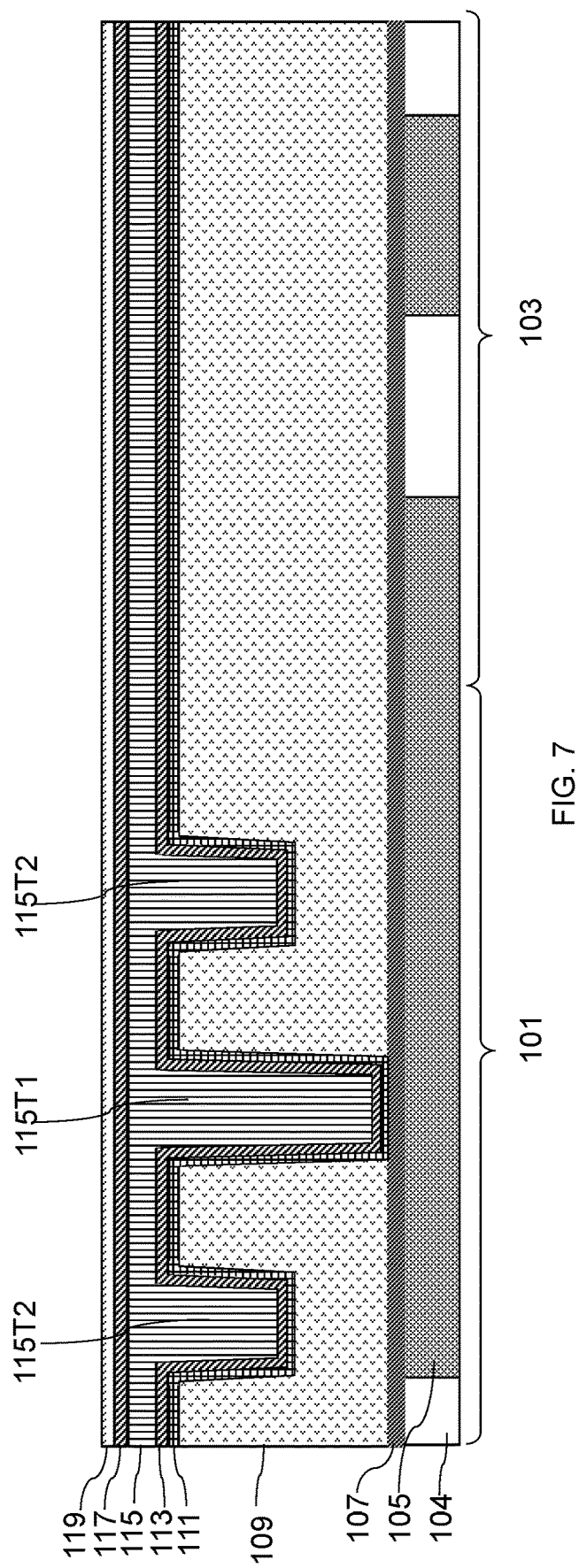
FIG. 7 is a vertical cross-sectional view illustrating forming a second high k dielectric layer and a blocking layer over the intermediate structure illustrated in FIG. 6 according to an embodiment of the present disclosure.

Referring to FIG. 7, a second high k dielectric layer 117 may optionally be formed over the metal layer 115. The second high k dielectric layer 117 may be made of the same material as the first high k dielectric layer 113 or of a different high k dielectric material. In various embodiments, the second high k dielectric layer 117 may have a thickness in a range of 15-100 Å, such as 50-75 Å, although thicker or thinner layers of the second high k dielectric layer 117 may be formed. For example, if the second high k dielectric layer 117 is made of ZAZ, the $ZrO_2$ may be in the range of 10-30 Å, the $Al_2O_3$ may be in the range of 10-30 Å and the $ZrO_2$ may be in the range of 10-30 Å.

In various embodiments a first blocking layer 119 may be deposited over the second high k dielectric layer 117. The first blocking layer 119 may be made of low dielectric constant (low-k) materials (e.g. k<5), such as silicon oxide, silicon nitride, silicon carbide (SiC), silicon carbonitride (SiCN), silicon oxycarbide (SiOC), silicon oxycarbon nitride (SiOCN), silicon oxynitride (SiON). Other suitable low-k dielectric materials are within the contemplated scope of disclosure. The first blocking layer 119 may have a thickness in a range of 200-400 Å, such as 250-350 Å.

Figure 8:
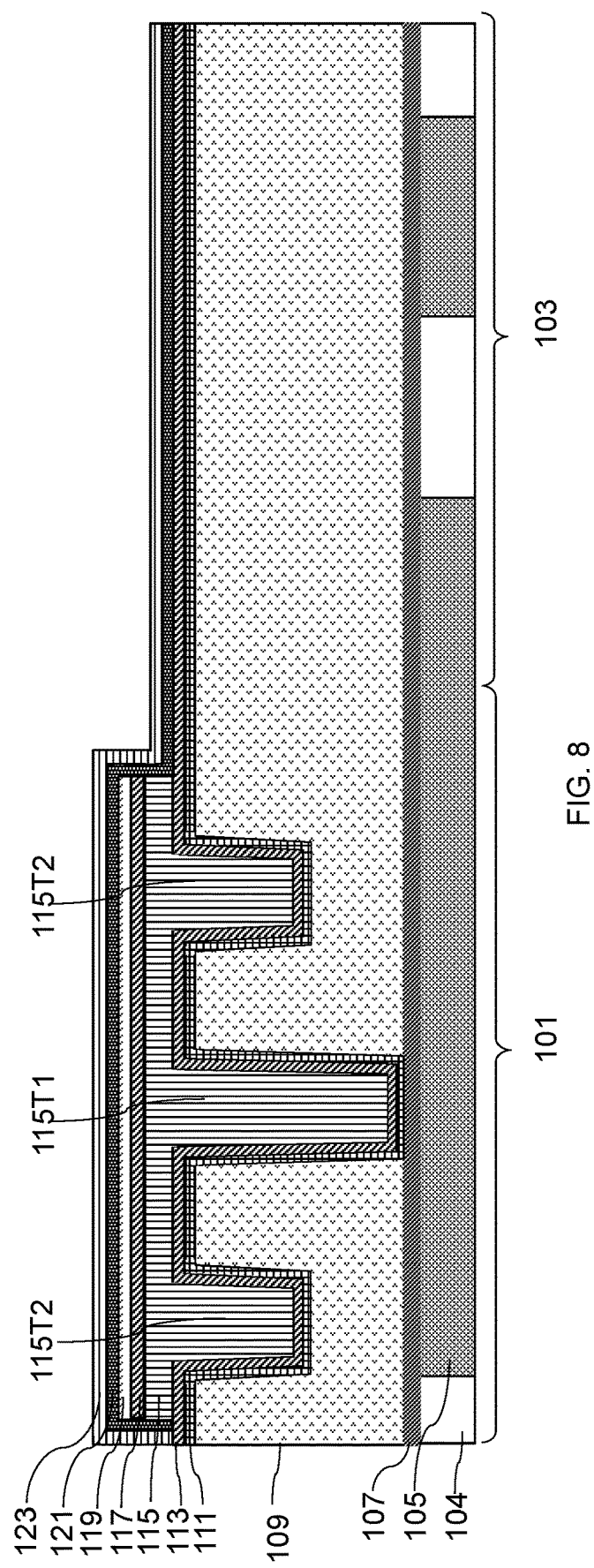
FIG. 8 is a vertical cross-sectional view illustrating patterning the metal layer, the second high k dielectric layer and the blocking layer and then depositing a passivation layer and an etch stop layer over the intermediate structure illustrated in FIG. 7 according to an embodiment of the present disclosure.

Referring to FIG. 8, the portions of the metal layer 115, second high k dielectric layer 117 and the first blocking layer 119 over the logic region 103 of the integrated semiconductor device may be removed. Removal of these layers may be accomplished by covering the capacitor region 101 with a photoresist and etching the exposed metal layer 115, second high k dielectric layer 117 and first blocking layer 119. After removal of the metal layer 115, second high k dielectric layer 117 and first blocking layer 119 from the logic region 103, the entire intermediate structure may be covered with a passivation layer 121 and a capacitor etch stop layer 123. The passivation layer 121 may comprise an undoped silicon glass (USG) or any other suitable passivating material. The passivation layer 121 may have a thickness in a range of 100-300 Å, such as 150-250 Å. The capacitor etch stop layer 123 may comprise the same material as the first etch stop layer 107. In other embodiments, the capacitor etch stop layer 123 may comprise a different material, such as SiN. The capacitor etch stop layer 123 may have a thickness in the range of 800-1200 Å, such as 900-1000 Å, although thicker or thinner etch stop layers 123 may be formed.

Figure 9:
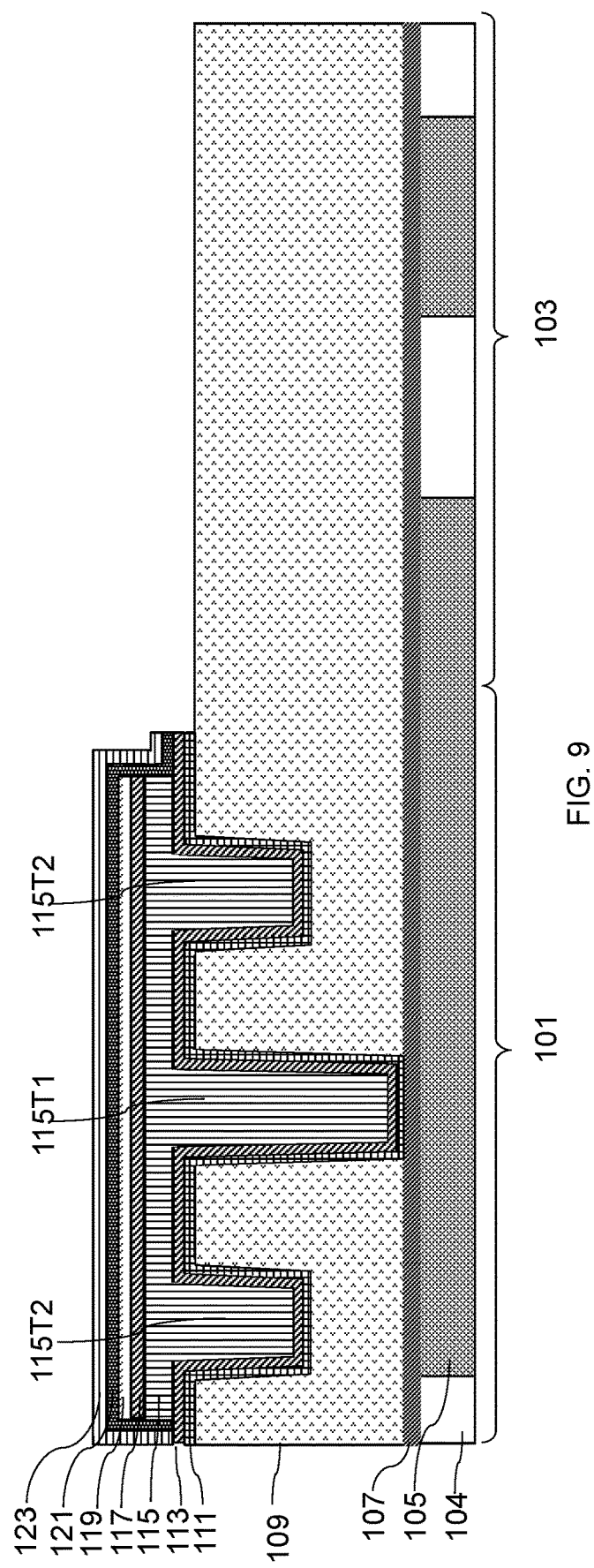
FIG. 9 is a vertical cross-sectional view illustrating, removing the passivation layer and the etch stop layer from a logic region of the chip according to an embodiment of the present disclosure.

Referring to FIG. 9, the portions of the passivation layer 121 and capacitor etch stop layer 123 over the logic region 103 of the integrated semiconductor device may be removed. To accomplish removal, a photoresist layer (not shown) may be deposited over the surface of the intermediate structure illustrated in FIG. 8 and patterned to expose the logic region 103. An etch process may be performed to remove the various layers including metal barrier liner 111, first high-k dielectric layer 113, metal layer 115, second high-k dielectric layer 117, first blocking layer 119 as well as passivation layer 121 and capacitor etch stop layer 123 exposed and uncovered by the photoresist layer. After removal of the various layers including metal barrier liner 111, first high-k dielectric layer 113, metal layer 115, second high-k dielectric layer 117, first blocking layer 119 as well as passivation layer 121 and capacitor etch stop layer 123, the photoresist layer may be removed.

Figure 10:
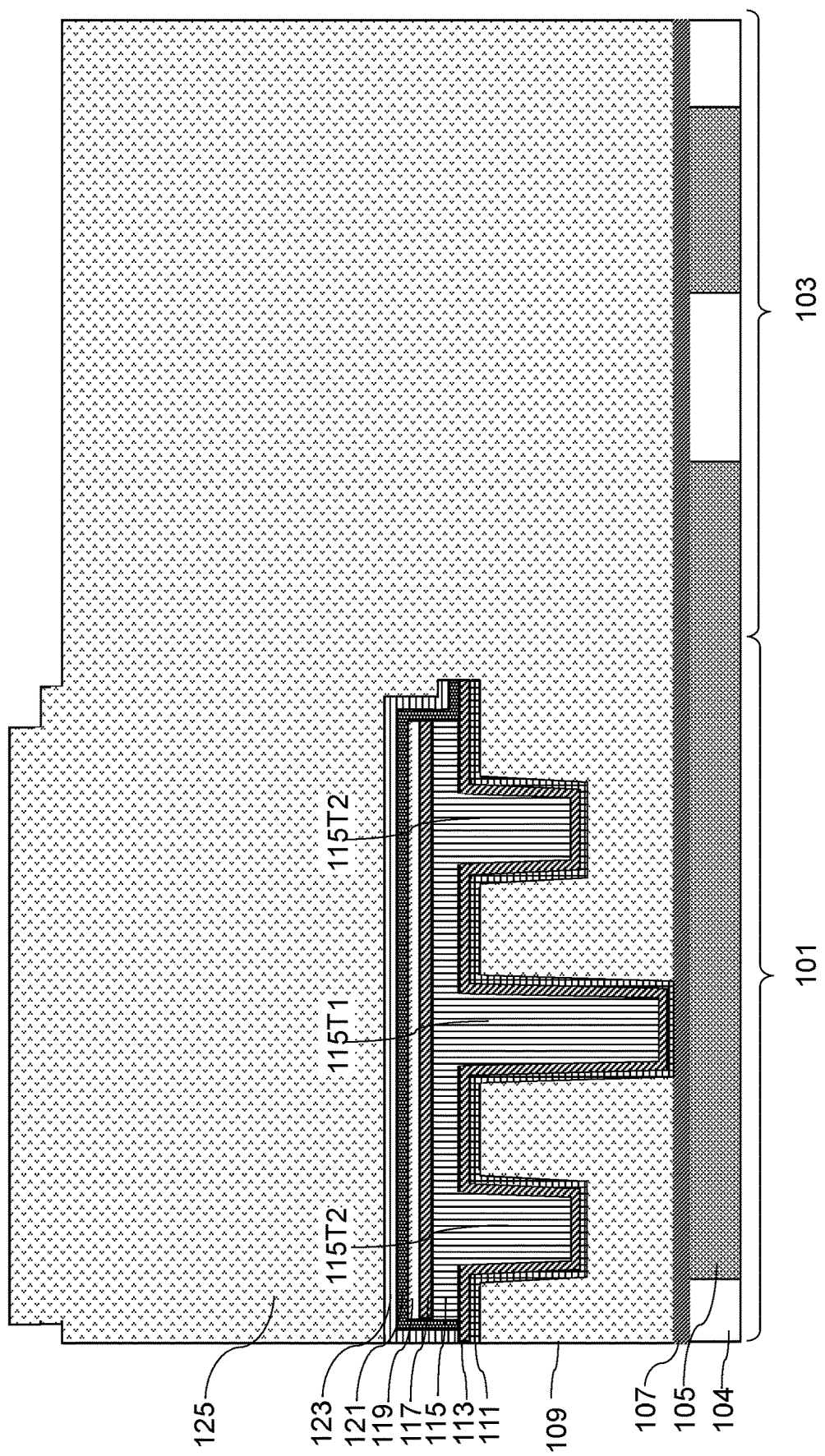
FIG. 10 is a vertical cross-sectional view illustrating depositing an oxide layer over the intermediate structure illustrated in FIG. 9 according to an embodiment of the present disclosure.

Referring to FIG. 10, an oxide layer 125 may be deposited over the intermediate structure illustrated in FIG. 10. In various embodiments, the oxide layer 125 may be made of an undoped silicon glass. However, any other suitable materials may be used. The oxide layer 125 may be deposited by any of a number of deposition process (such as a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like). A chemical mechanical planarization process may be performed to remove portions of the deposited oxide layer 125 from above the horizontal plane Referring to FIG. 11, the oxide layer 125 may be planarized. Planarization may be accomplished, for example, by chemical-mechanical polishing. After planarization, the oxide layer 125 may a have a thickness in a range 1.6-2.0 kÅ, such as 1.7-1.9 kÅ.

Figure 11:
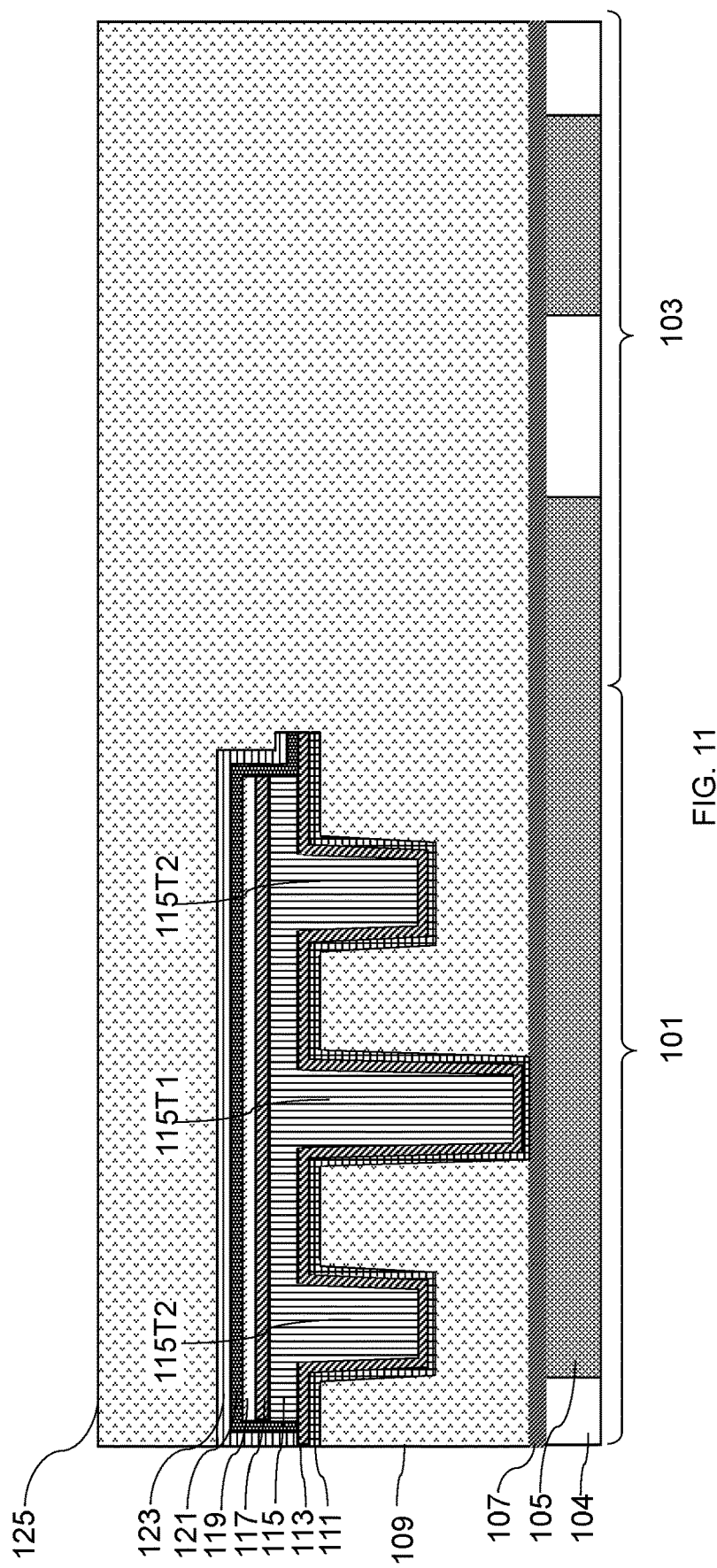
FIG. 11 is a vertical cross-sectional view illustrating planarizing the oxide layer according to an embodiment of the present disclosure.
Figure 12:
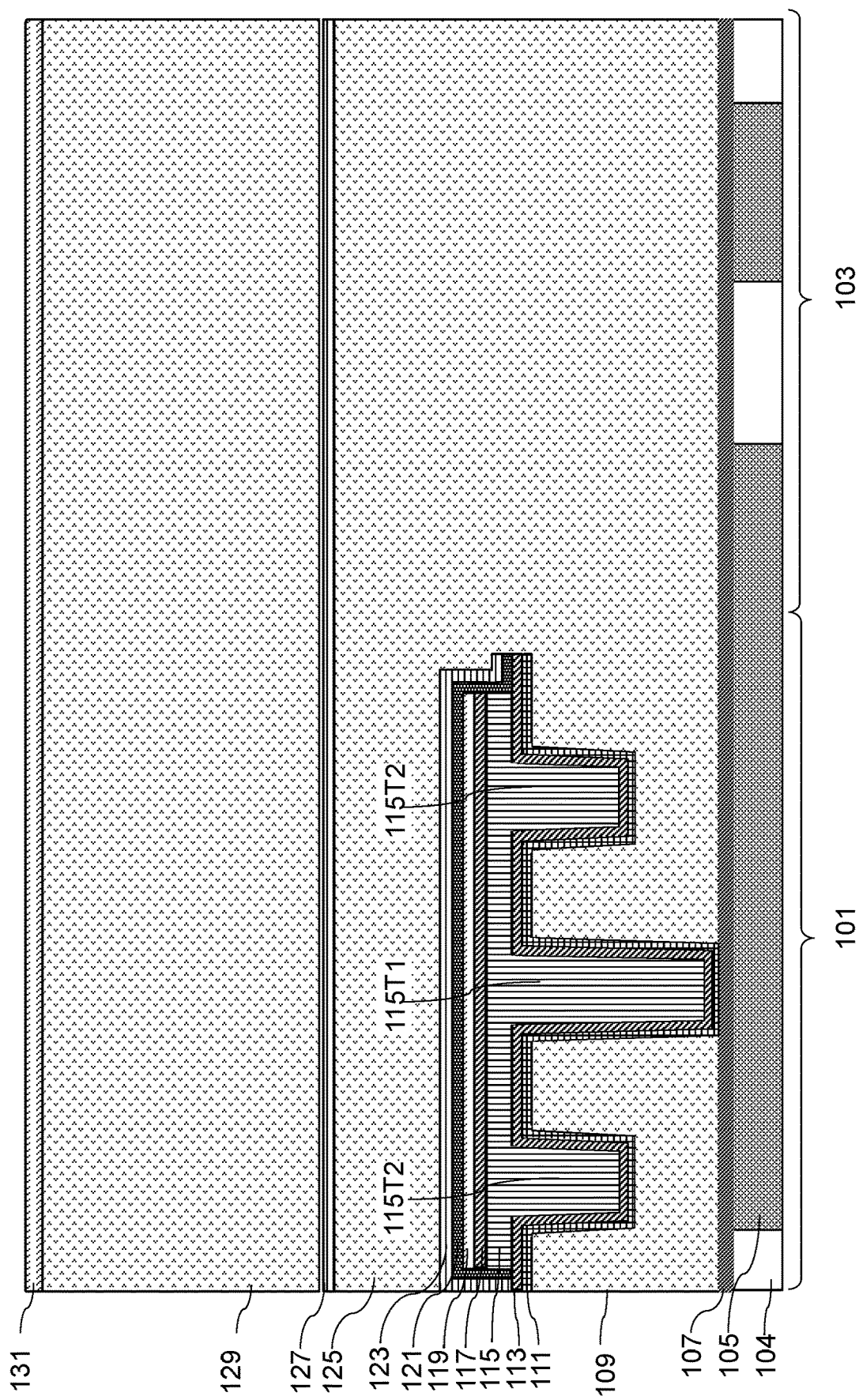
FIG. 12 is a vertical cross-sectional view illustrating forming an etch stop layer, an oxide layer and a blocking layer over the intermediate structure illustrated in FIG. 11 according to an embodiment of the present disclosure.

Referring to FIG. 12, a second capacitor etch stop layer 127 may be deposited over the intermediate structure illustrated in FIG. 11. In various embodiments, the second capacitor etch stop layer 127 may be made of SiN. However, the second capacitor etch stop layer 127 may be made of any suitable material. After forming the second capacitor etch stop layer 127, an oxide layer 129 may be deposited over the second capacitor etch stop layer 127. The second capacitor etch stop layer 127 may be made of the same material as the first capacitor etch stop layer 123 or of a different material. After forming the oxide layer 129, a second blocking layer 131 may be formed over the oxide layer 129. The second blocking layer 131 may be made of the same material as the first blocking layer 119 or any other suitable blocking material.

Figure 13:
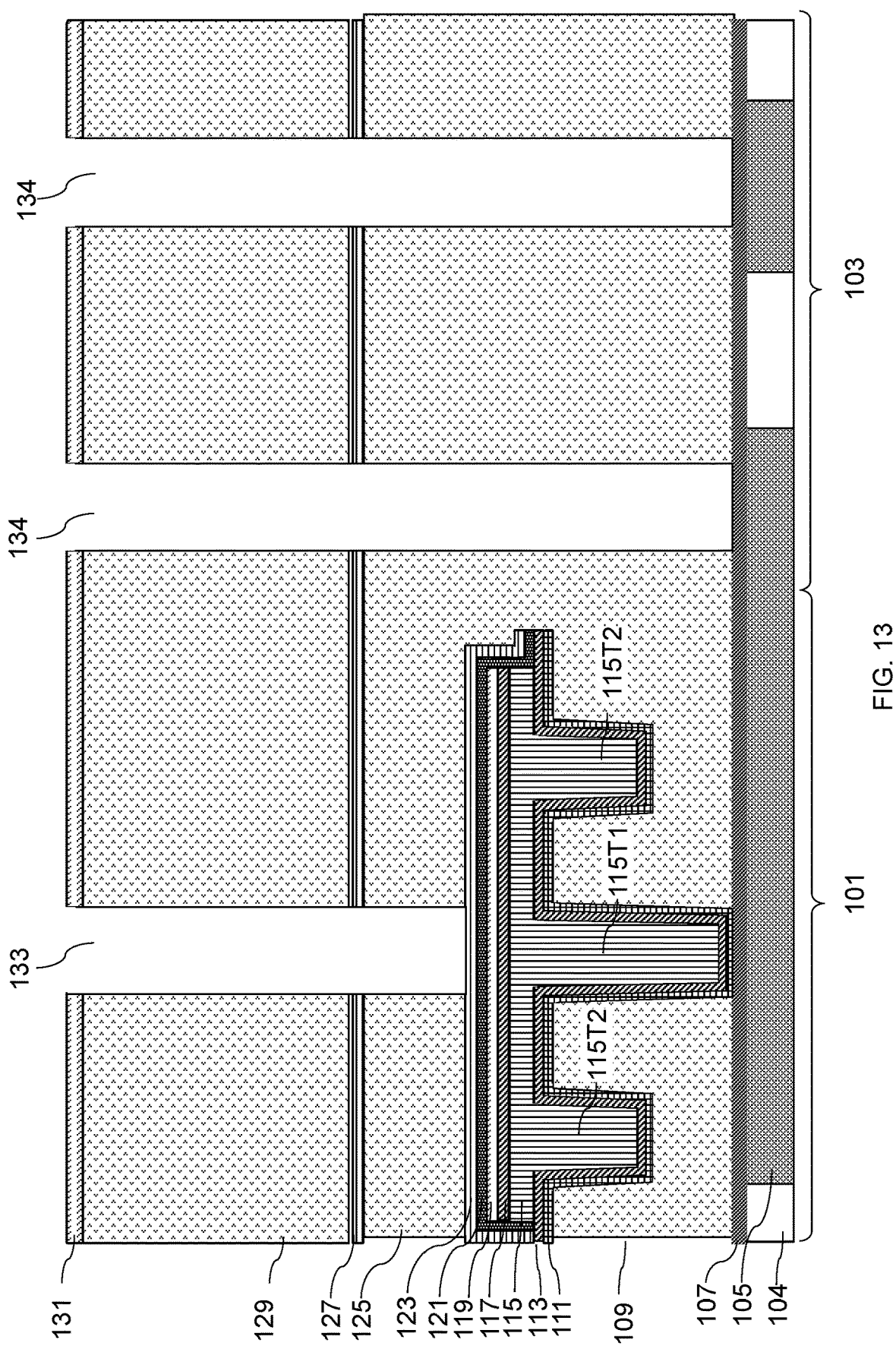
FIG. 13 is a vertical cross-sectional view illustrating forming contact via holes in the intermediate structure illustrated in FIG. 12 according to an embodiment of the present disclosure.

Referring to FIG. 13, contact via holes 133 may be formed in the intermediate structure illustrated in FIG. 12. As illustrated in FIG. 13, a first contact via hole 133 may be formed such that it stops on capacitor etch stop layer 123. The second and third contact via holes 134 may be formed in the logic region 103 and extend to the first etch stop layer 107. The contact via holes 133 may be formed by wet etching or dry etching. Further, the second and third contact via holes 134 may be formed in a single etching step or in a series of etching steps.

Figure 14:
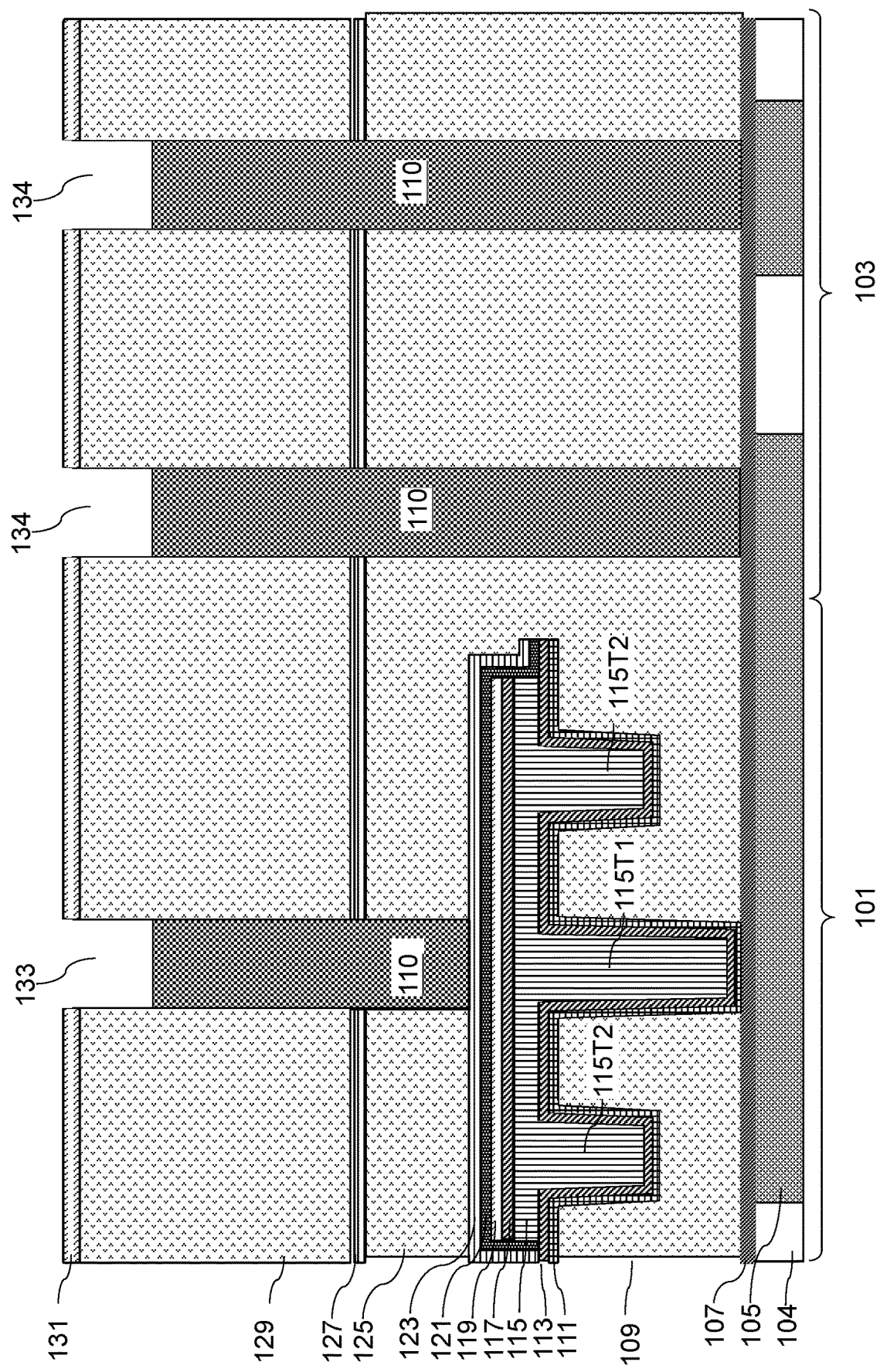
FIG. 14 is a vertical cross-sectional view illustrating partially filling the contact via holes formed in the intermediate structure illustrated in FIG. 13 according to an embodiment of the present disclosure.

Referring to FIG. 14, the contact via holes 133, 134 may be partially filled with a photoresist layer 110. Then a portion of the photoresist material 110 may be selectively removed from the contact via holes 133, 134 such that exposed depth of all three contact via holes 133, 134 is the same.

Figure 15:
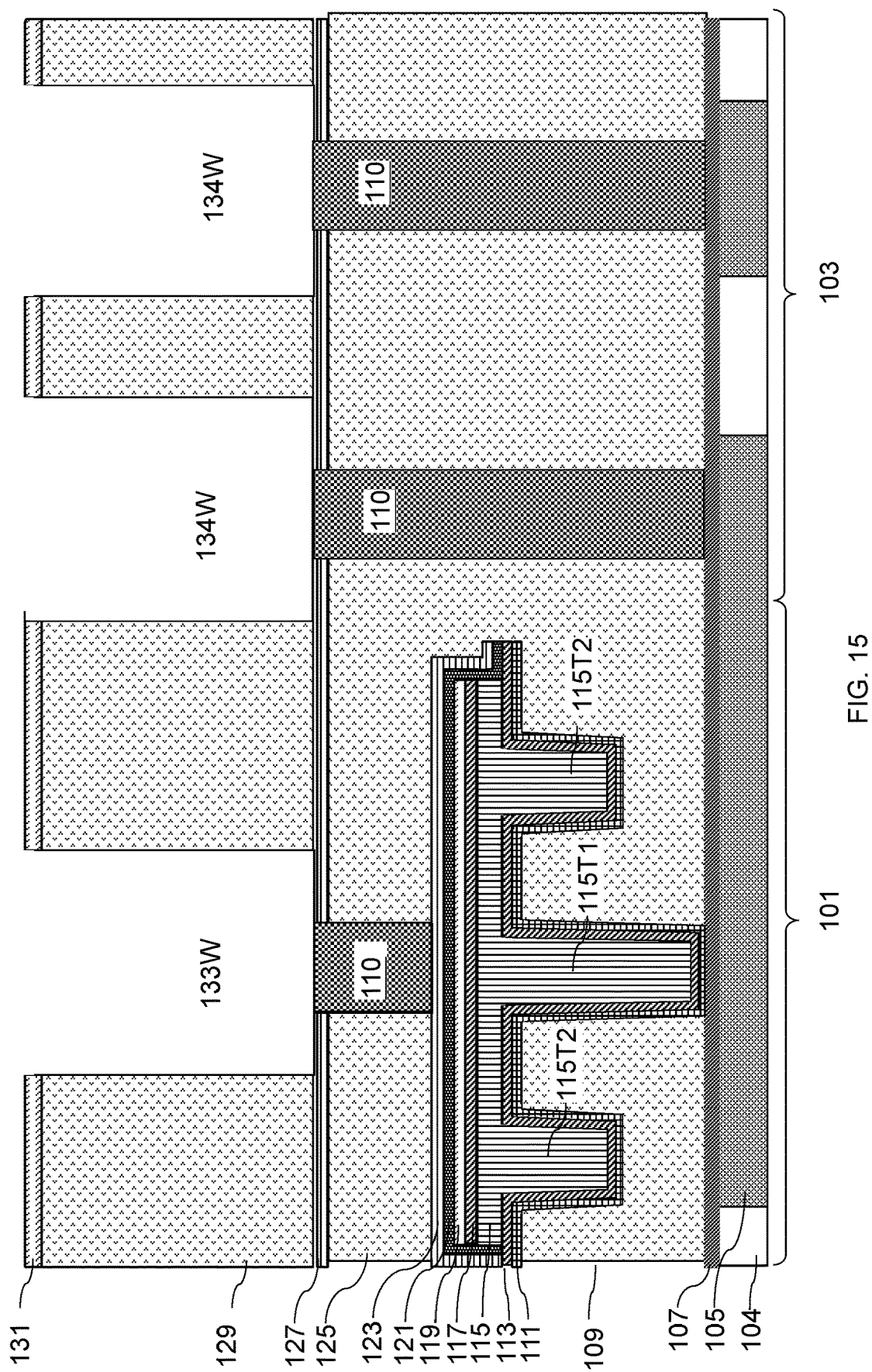
FIG. 15 is a vertical cross-sectional view illustrating widening an upper portion of the contact via holes in the intermediate structure illustrated in FIG. 14 according to an embodiment of the present disclosure.

Referring to FIG. 15, an upper portion of the contact via holes 133, 134 may be widened to form a widened portion 133W of the contact via holes 133 and widened portion 134W of the contact via holes 134. The widened portion 133W, 134W of the contact via holes 133, 134 may vertically extend from the second blocking layer 131 to the second capacitor etch stop layer 127.

Figure 16:
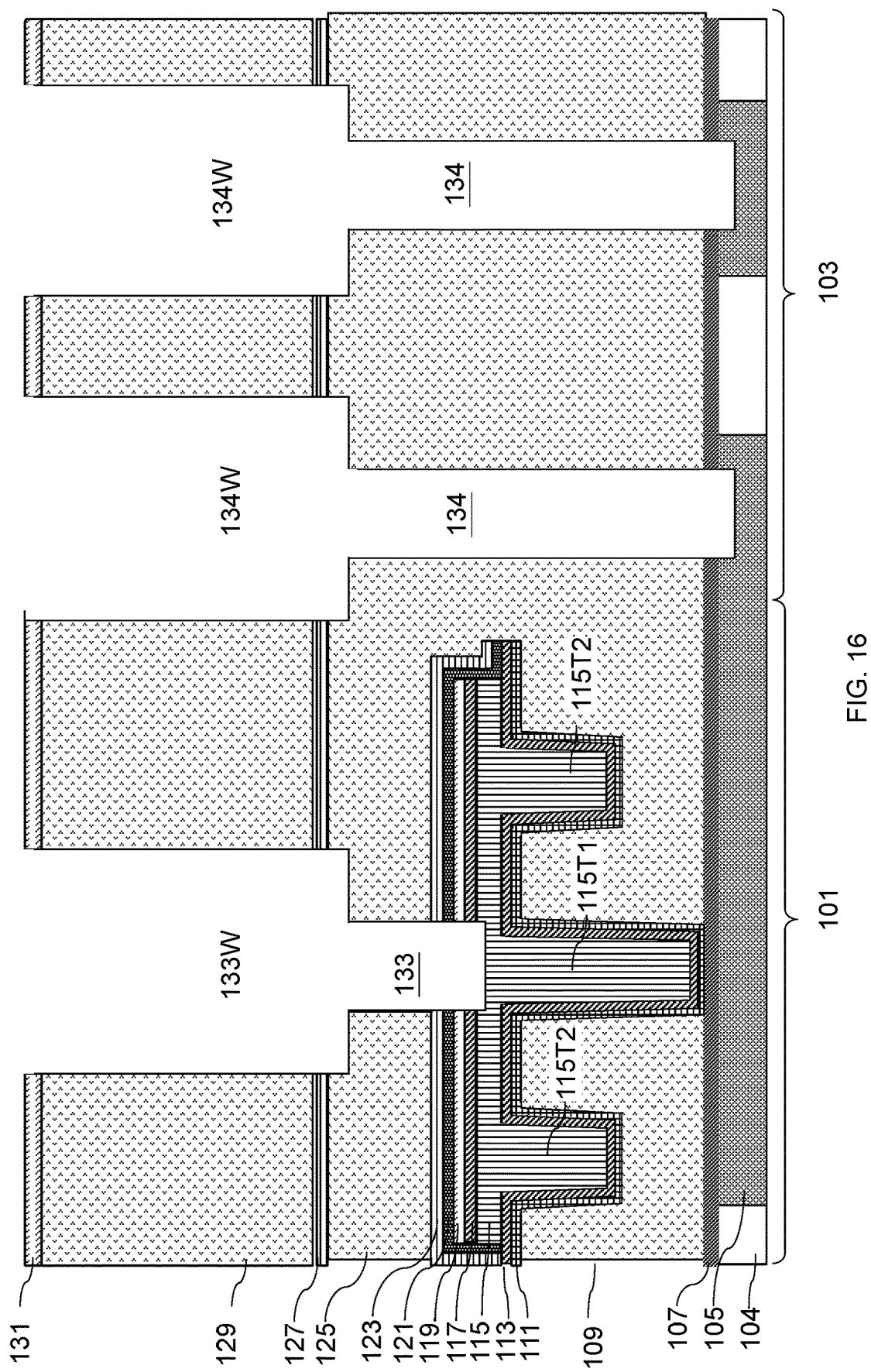
FIG. 16 is a vertical cross-sectional view illustrating removing photoresist from lower portions of the contact via holes in the intermediate structure illustrated in FIG. 15 according to an embodiment of the present disclosure.

Referring to FIG. 16, the remaining portion of the photoresist layer 110 in the contact via holes 133, 134 may be removed. Removal of the photoresist layer 110 may be accomplished by ashing or dissolving with a solvent. Further, the contact via hole 133 over the MIM capacitor may be extended to the metal layer 115. Further, the contact via holes 134 in the logic region of the integrated semiconductor device may be extended through the first etch stop layer 107 to the underlying metal line 105.

Figure 17:
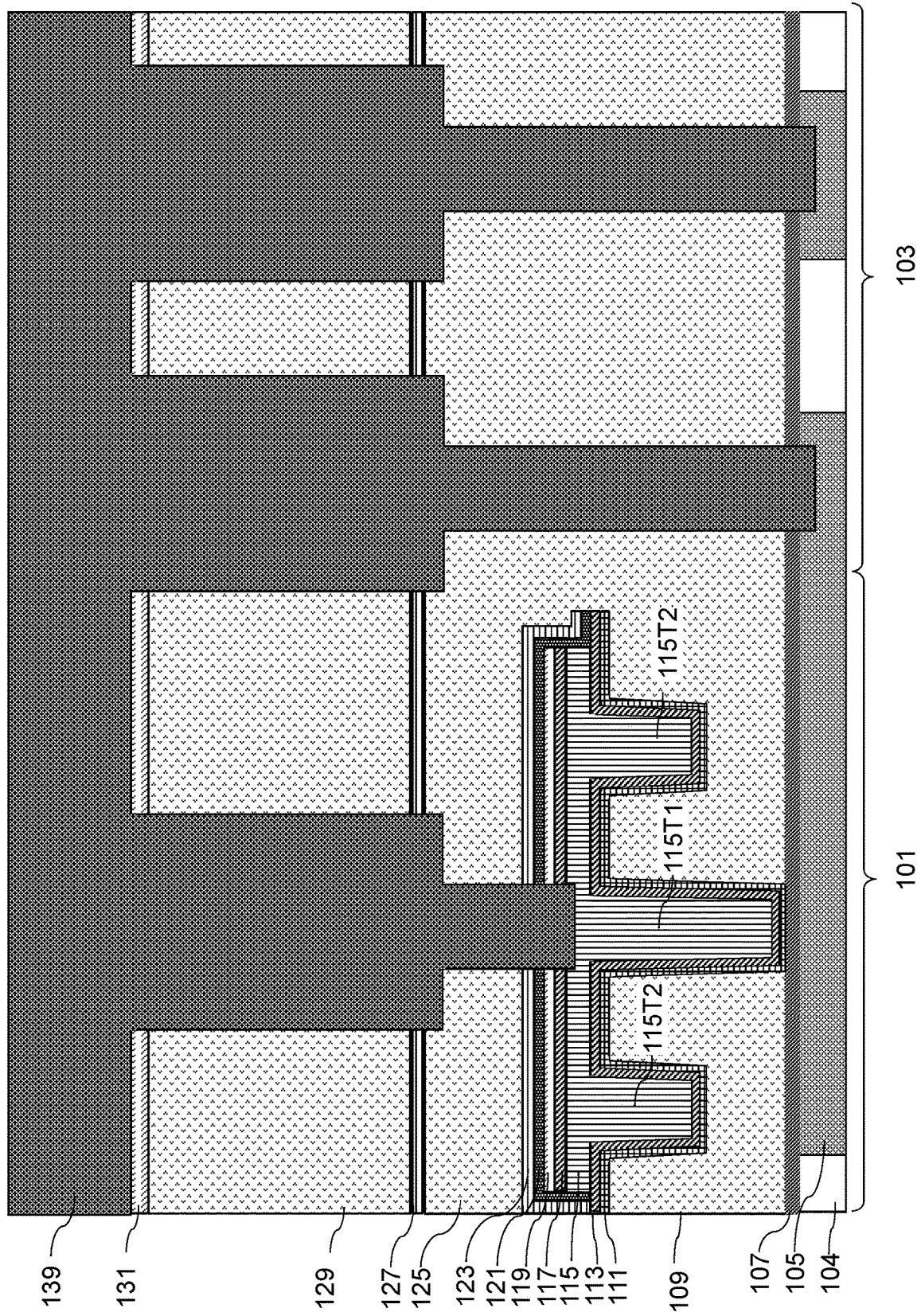
FIG. 17 is a vertical cross-sectional view illustrating filling the contact via holes with a conductive material according to an embodiment of the present disclosure.

Referring to FIG. 17, the contact via hole 133, 134 including the widened portion 133W, 134W may be filled with a conductive material 139 to form contact via structures. The conductive material 139 may be made of any suitable material such as, but not limited to, Ti, Ta, W, Cu, Co, Mo, Ru, TiN, TaN and WN. Other suitable metallic fill materials may be within the contemplated scope of disclosure.

Figure 18:
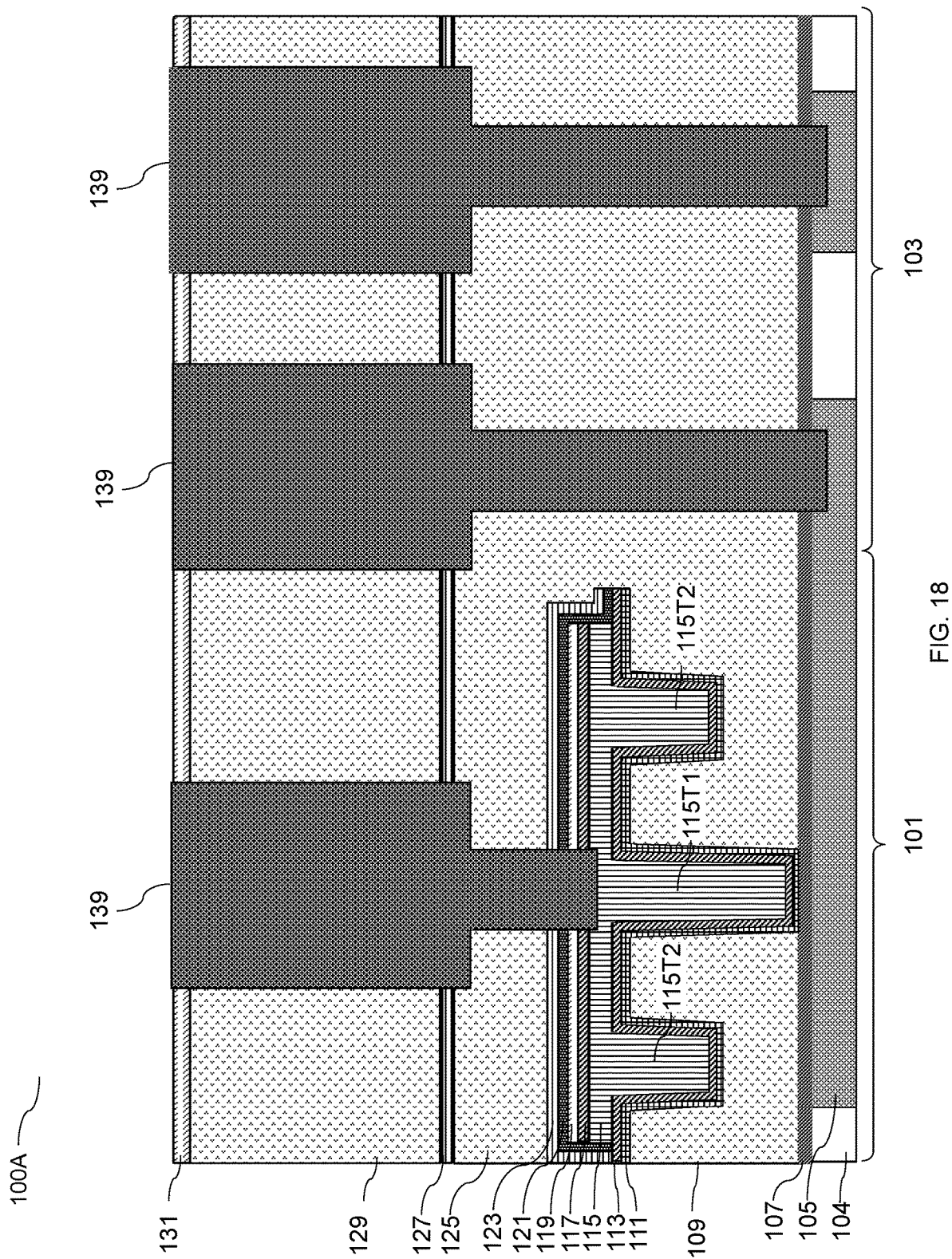
FIG. 18 is a vertical cross-sectional view illustrating planarizing the surface of the intermediate structure illustrated in FIG. 17 according to an embodiment of the present disclosure.

Referring to FIG. 18, the top surface of the intermediate structure illustrated FIG. 17 may be planarized to remove any excess conductive material 139 from the top surface of the intermediate structure. In this manner, an integrated semiconductor device 100A having MIM capacitors with a comb shape may be formed. In an embodiment, the integrated semiconductor device 100A may be a DRAM. Other devices having MIM capacitors with a comb shape are also contemplated.

Referring to FIG. 19, the integrated semiconductor device 100A may be tested prior to packaging with a test probe 141, such as a probe card. In various embodiments, the planarizing process is performed by a CMP process, and removes excess conductive material 139, the second blocking layer 131 and portions of the oxide layer 129.

Figure 20A:
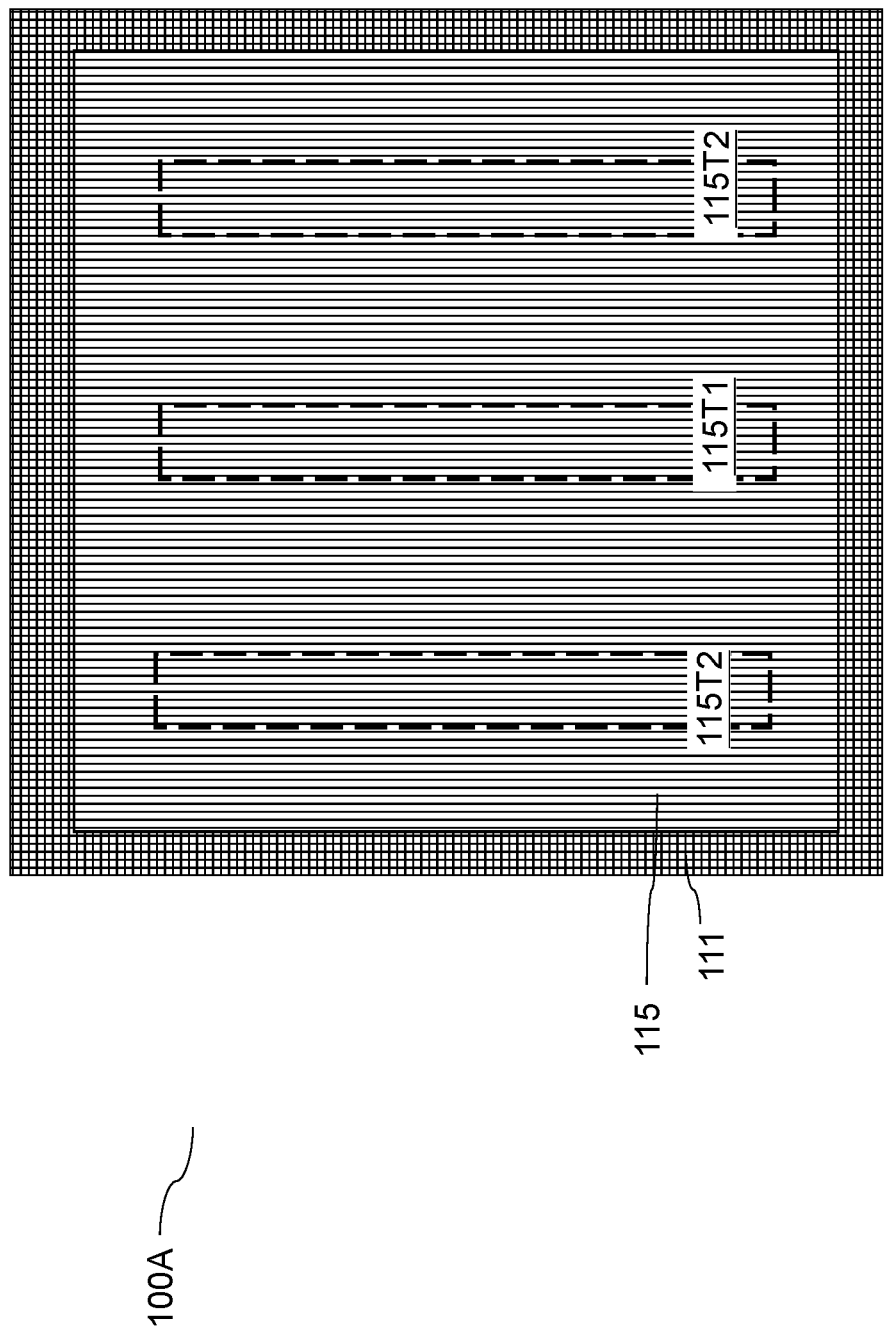
FIG. 20A is a top down view illustrating the MIM capacitor illustrated in FIG. 19 according to an embodiment of the present disclosure.

Referring to FIG. 20A, a top down view of the MIM capacitor of FIG. 19 is illustrated. In this embodiment, the conductive metal barrier layer 111 and the first high k dielectric layer 113 is larger than the metal layer 115. However, in alternative embodiments, the conductive metal barrier liner 111 and the first high k dielectric layer 113 may be the same size or smaller than the metal layer 115. The first tine 115T1 corresponding to the first trench 108 and the second tines 115T2 corresponding to the second trenches 108S are indicated by the dashed rectangles.

Figure 20B:
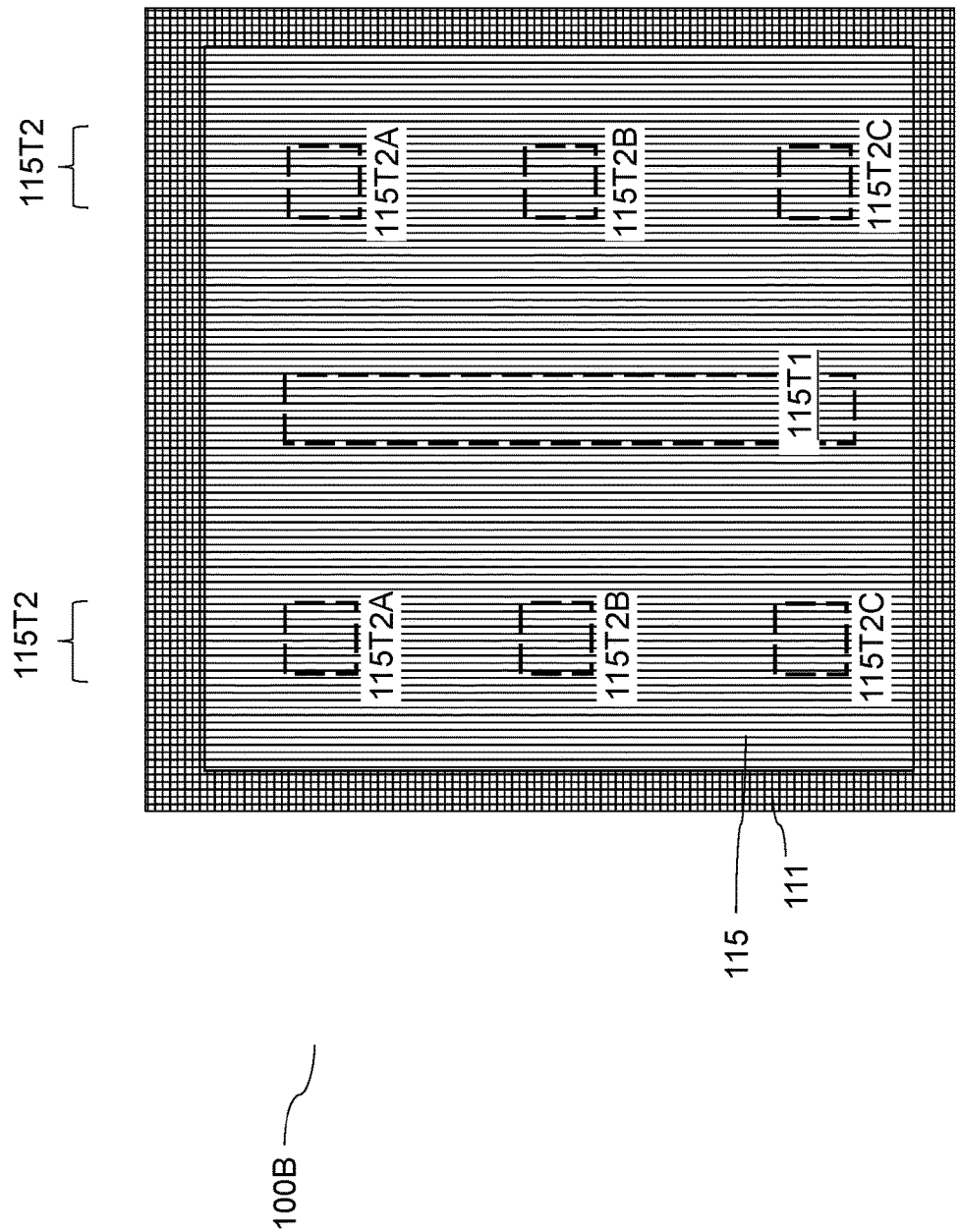
FIG. 20B is a top down view illustrating a MIM capacitor according to another embodiment of the present disclosure.

FIG. 20B illustrates another embodiment of a MIM capacitor 100B. In this embodiment, the second tines 115T2 may have a rectangular cross section with a smaller aspect ratio (i.e. ratio of length to width) than the first tine 115T1. In an aspect as illustrated, the length and the width may be the same (aspect ratio of 1:1), resulting in a square cross section. Further, as illustrated in FIG. 20B the second tines 115T2 may comprise a plurality of second sub-tines 115T2A, 115T2B, 115T2C connected in an upper portion such that the total length of the second tines 115T2 is essentially the same as the as the length of the first tines 115T1. In an embodiment, the spacing between the plurality of second sub-tines 115T2A, 115T2B, 115T2C may be the same as the spacing between the first tine 115T1 and the second tines 115T2.

FIG. 20C illustrates another embodiment of a MIM capacitor 100C. In this embodiment, the second tines 115T2 may have a non-rectangular cross section. As illustrated, the second tines 115T2 may have a circular cross section. However, other cross sectional shapes may be formed. For example, any closed polygon shape (e.g., hexagon, octagon, etc.) may be used. Further, as illustrated in FIG. 20C the second tines 115T2 may comprise a plurality of second sub-tines 115T2A, 115T2B, 115T2C connected in an upper portion such that the total length of the second tines 115T2 is essentially the same as the as the length of the first tines 115T1. In an embodiment, the spacing between the plurality of second sub-tines 115T2A, 115T2B, 115T2C may be the same as the spacing between the first tine 115T1 and the second tines 115T2.

Figure 21A:
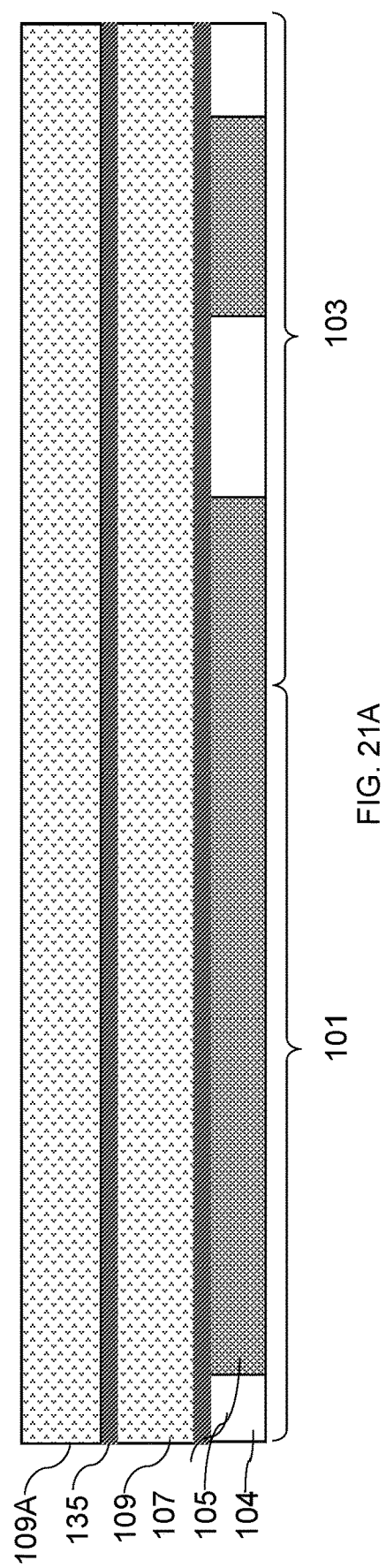
FIG. 21A is a vertical cross-sectional view illustrating forming a first etch stop layer, a second etch stop layer and a dielectric layer over a metal line according to an alternative embodiment of the present disclosure.

Referring to FIGS. 21A-21E, an alternative integrated semiconductor device 200 is illustrated. The integrated semiconductor device 200 is similar to the integrated semiconductor device 100A illustrated in FIG. 19. Referring to FIG. 21A, the integrated semiconductor device 200 includes a second etch stop layer 135 located on top of the dielectric layer 109. Thus, the second etch stop layer 135 is located at a greater distance from an underlying substrate (not shown) than first etch stop layer 107. Similar to the intermediate structure illustrated in FIG. 1, in FIG. 21A, a first etch stop layer 107 may be deposited over metal line 105, such as a metal line 105 formed in an interposer. The metal line 105 may also be located or embedded in an interlayer dielectric level (IDL) layer 104 in the interposer or in a dielectric layer in a back-end-of-the-line (BEOL) portion of an integrated semiconductor device. Next, a dielectric layer 109 may be deposited over first etch stop layer 107. The metal line 105 may be made of any suitable material such as, but not limited to, Ti, Ta, W, Cu, Co, Mo, Ru, TiN, TaN and WN. The first etch stop layer 107 may be made of any suitable material. In various embodiments, the first etch stop layer 107 may be made of SiC. Further, the first etch stop layer 107 may have a thickness in the range of 250-750 Å, such as 400-600 Å, although thicker or thinner etch stop layers may be used. The dielectric layer 109 may be made of any suitable material. In various embodiments, the dielectric layer 109 may be made of a plasma enhanced oxide (PEOX), such as $SiO_2$ made by a plasma enhance oxidation process. A second etch stop layer 135 may be formed over the dielectric layer 109. The second etch stop layer 135 may be made of any suitable material. In various embodiments, the second etch stop layer 135 may be made of SiC. In this embodiment, the dielectric layer 109 may have thickness in a range of 900-1400 Å, such as 1100-1300 Å although thicker or thinner dielectric layer 109 may be used. The second etch stop layer 135 may have a thickness in the range of 250-750 Å, such as 400-600 Å although thicker or thinner etch stop layers may be used. After forming the second etch stop layer 135, a second dielectric layer 109A may be formed on top of the second etch stop layer 135. The second dielectric layer 109A may have thickness in a range of 900-1400 Å, such as 1100-1300 Å although thicker or thinner dielectric layer 109 may be used.

Figure 21B:
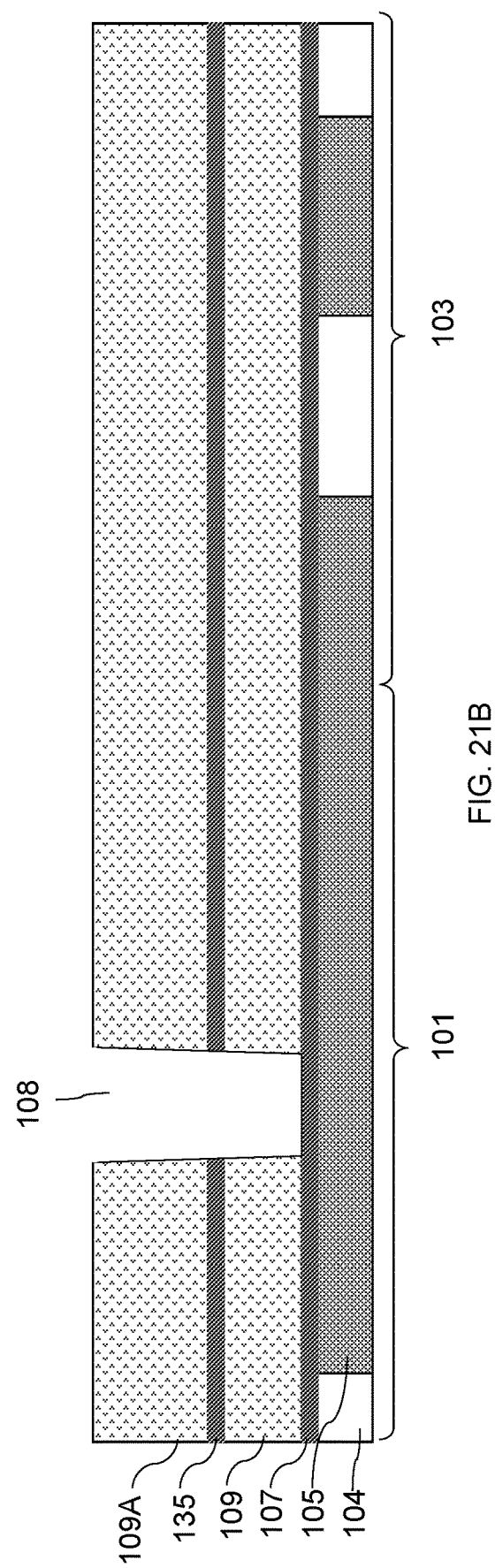
FIG. 21B is a vertical cross-sectional view illustrating etching a first trench in the dielectric layer according to an alternative embodiment of the present disclosure.

Referring to FIG. 21B, a first trench 108 may be formed in the dielectric layers 109, 109A and the second etch stop layer 135. The first trench 108 may be formed by depositing, patterning a photoresist layer (not shown) and patterning the dielectric layers 109, 109A and through the second etch stop layer 135. In various embodiments, dielectric layers 109, 109A and through the second etch stop layer 135 may be etched until the etch process reaches the first etch stop layer 107. The first trench 108 may have a width in the range of 0.12-0.2 µm, such as 0.14-0.18 µm, although wider or narrower trenches may be formed. In various embodiments, the sidewalls of the first trench 108 may slope inward such that the bottom of the first trench 108 is narrower than the top of the first trench 108. When the etch process is complete, the photoresist layer may be removed, such as by ashing or dissolving in a solvent.

Figure 21C:
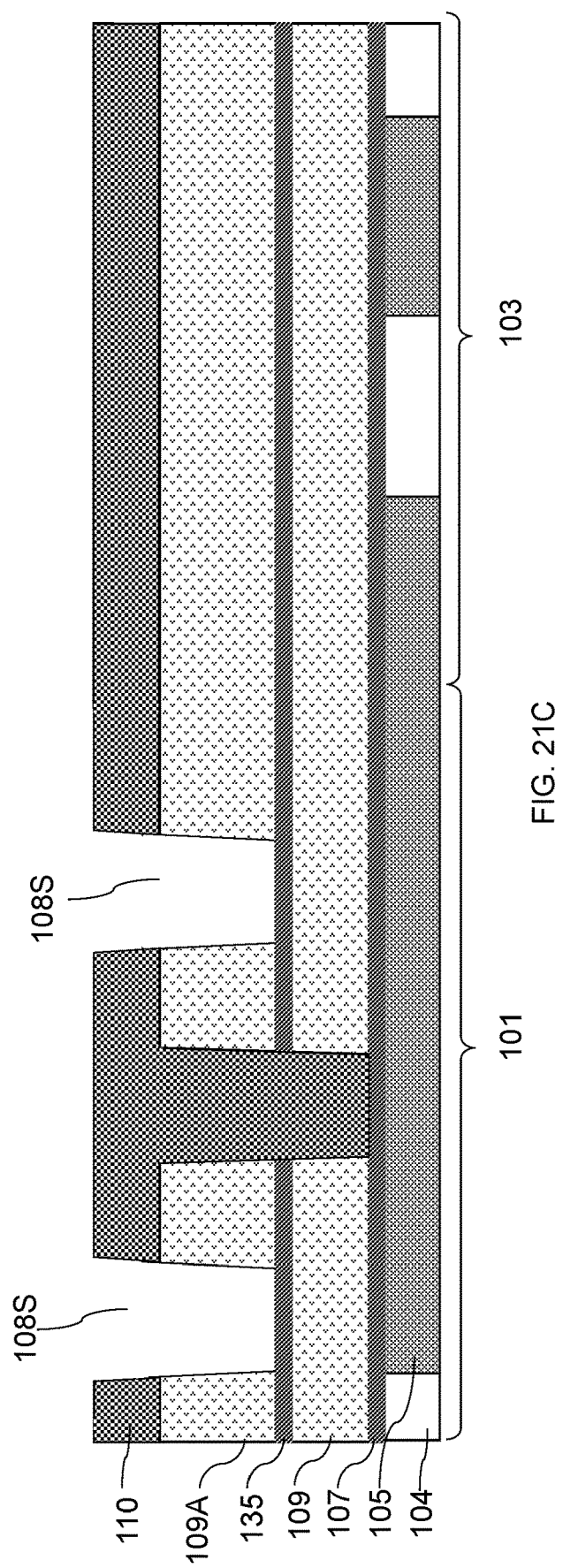
FIG. 21C is a vertical cross-sectional view illustrating forming second trenches according to an alternative embodiment of the present disclosure.

Referring to FIG. 21C, a photoresist layer 110 may be deposited over the intermediate structure illustrated in FIG. 21B. In various embodiments, the photoresist layer 110 may fill the first trench 108. The photoresist layer 110 may then be patterned such that one or more portions of the surface of the dielectric layer 109A are exposed. The exposed portions of the dielectric layer 109A may be etched until the second etch stop layer 135 is reached to form one or more second trenches 108S. In various embodiments, the second trenches 108S are shallower than the first trench 108. In various embodiments, the depth of the second trenches 108S may be in the range of 0.25-0.75 times the depth of the first trench 108, such as 0.4-0.6 times the depth of the first trench 108. The second trenches 108S may have a width in the range of 0.12-0.2 µm, such as 0.14-0.18 µm, although wider or narrower trenches may be formed. Similar to the first trenches 108, the sidewalls of the second trenches 108S may slope inwardly such that the bottom of the second trenches 108S are narrower than the top of the second trenches 108S. Etching may be performed by wet etching or dry etching.

Figure 21D:
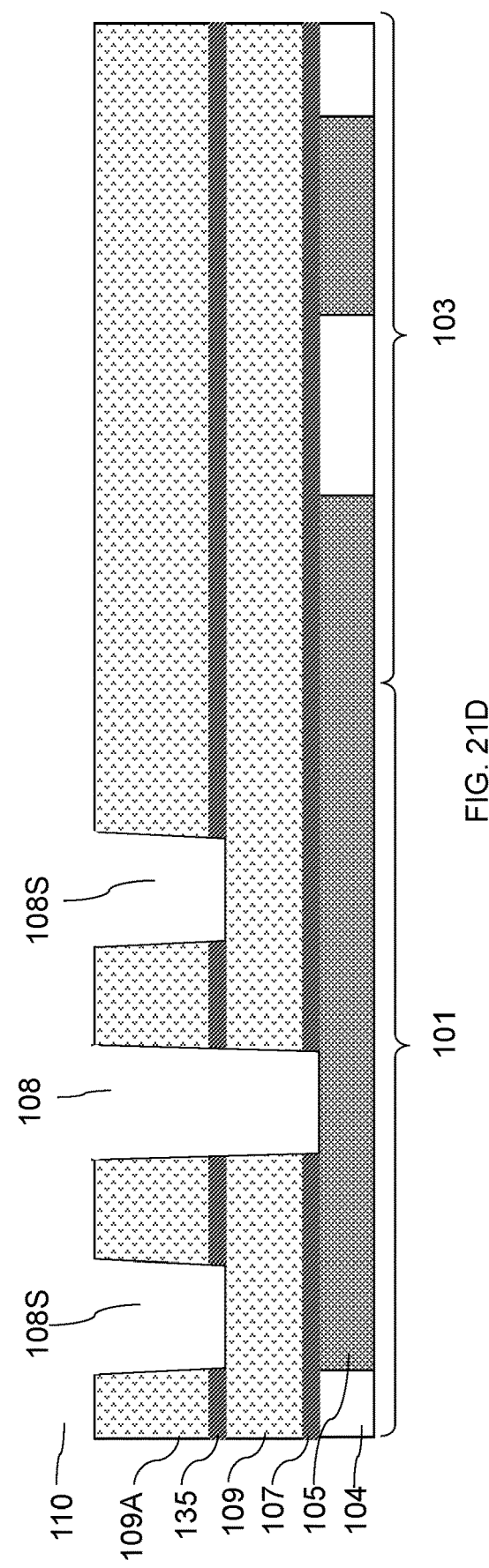
FIG. 21D is a vertical cross-sectional view illustrating removing photoresist from the intermediate structure illustrated in FIG. 21C according to an alternative embodiment of the present disclosure.

Referring to FIG. 21D, the photoresist layer 110 may be removed by ashing or dissolving in a solvent. An additional etch process may be performed to remove the first etch stop layer 107 that may be exposed at the bottom of first trench 108 and the second etch stop layer 135 that may be exposed at the bottom of each of second trenches 108S.

Figure 21E:
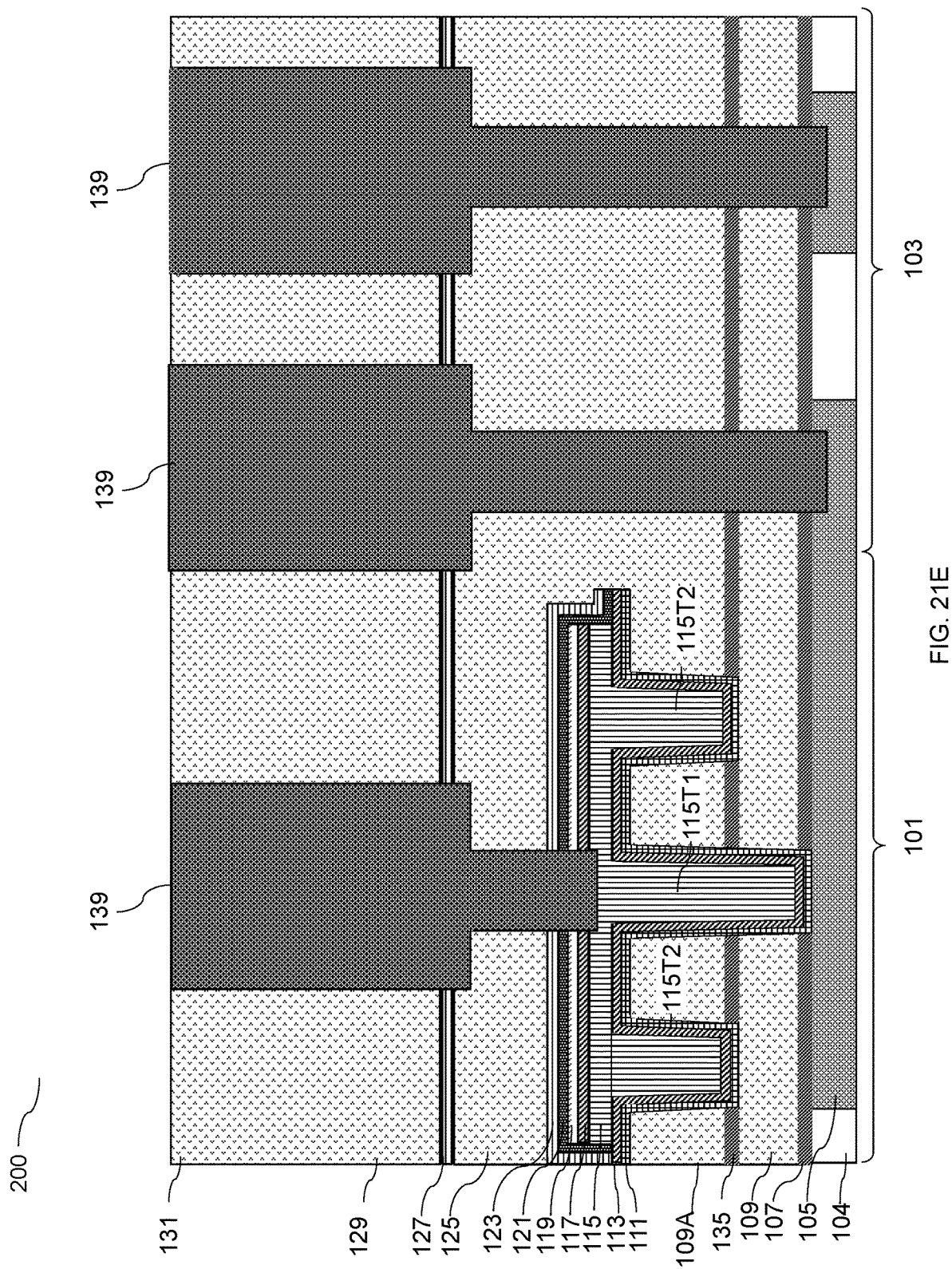
FIG. 21E is a vertical cross-sectional view illustrating a MIM capacitor having a first etch stop layer below the first trench and a second etch stop layer below the second trenches according to an alternative embodiment of the present disclosure.

Referring to FIG. 21E, the processing steps described above with reference to FIGS. 5-18 may be performed on the intermediate structure illustrated in FIG. 21D to provide the integrated semiconductor device 200 illustrated in FIG. 21E. As noted above, the integrated semiconductor device 200 illustrated in FIG. 21E includes a second etch stop layer 135 located on top of the dielectric layer 109. Thus, the second etch stop layer 135 is located at a greater distance from an underlying substrate (not shown) than first etch stop layer 107.

Figure 22B:
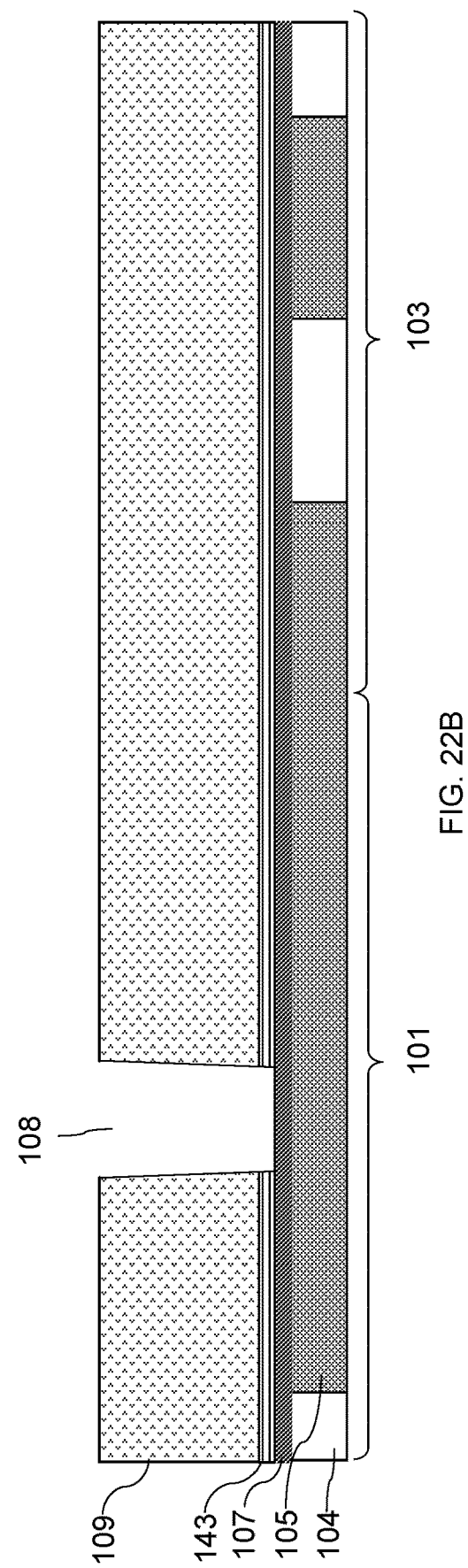
FIG. 22B is a vertical cross-sectional view illustrating etching a first trench in the dielectric layer according to an alternative embodiment of the present disclosure.

Referring to FIG. 22A-22E, an alternative integrated semiconductor device 300 is illustrated. The integrated semiconductor device 300 is similar to the integrated semiconductor device 100A illustrated in FIG. 19. Referring to FIG. 22A, the integrated semiconductor device 300 includes a secondary etch stop layer 143 formed directly on top of the first etch stop layer 107. The secondary etch stop layer 143 may be made of a different material from the first etch stop layer 107. The secondary etch stop layer 143 may have a thickness in the range of 500-1500 Å, such as 800-1200 Å, although thicker or thinner secondary etch stop layers may be used.

Referring to FIG. 22B, a first trench 108 may be formed in the dielectric layer 109 and through the secondary etch stop layer 143. The first trench 108 may be formed by depositing, patterning a photoresist layer (not shown) and patterning the dielectric layer 109 and the secondary etch stop layer 143. In various embodiments, dielectric layer 109 and through the secondary etch stop layer 143 may be etched until the etch process reaches the first etch stop layer 107. The first trench 108 may have a width in the range of 0.12-0.2 μm, such as 0.14-0.18 μm, although wider or narrower trenches may be formed. In various embodiments, the sidewalls of the first trench 108 may slope inward such that the bottom of the first trench 108 is narrower than the top of the first trench 108. When the etch process is complete, the photoresist layer may be removed, such as by ashing or dissolving in a solvent.

Figure 22C:
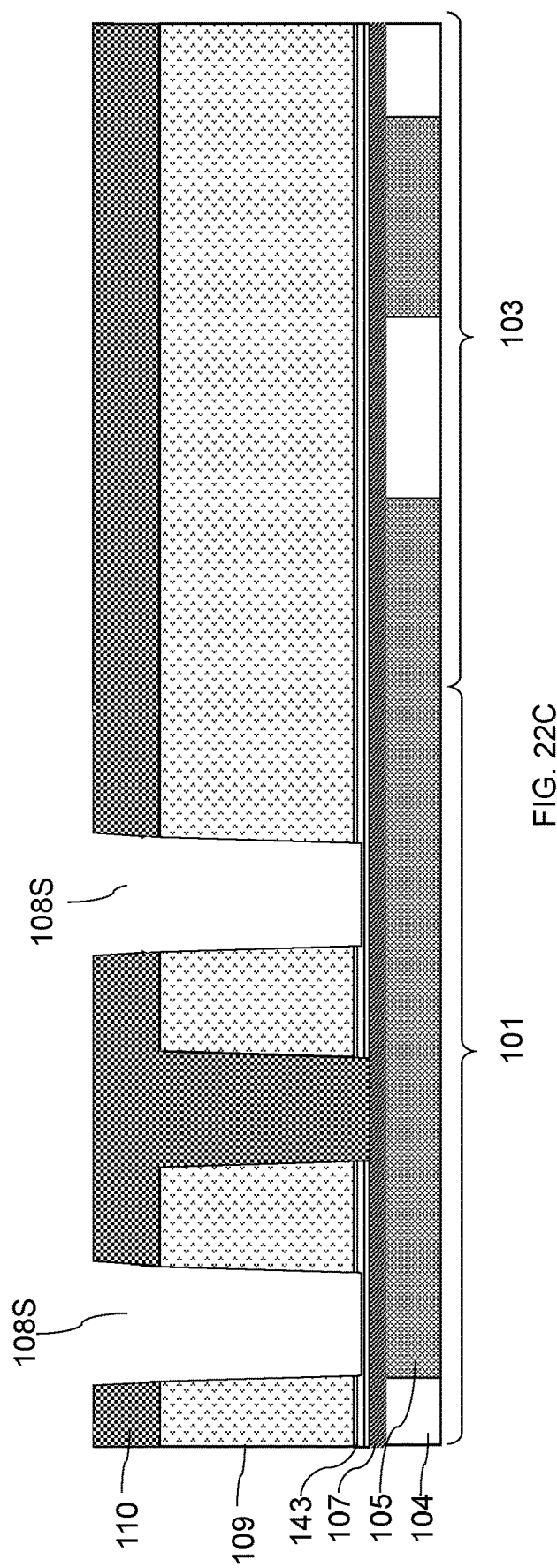
FIG. 22C is a vertical cross-sectional view illustrating forming second trenches according to an another embodiment of the present disclosure.

Referring to FIG. 22C, a photoresist layer 110 may be deposited over the intermediate structure illustrated in FIG. 22B. In various embodiments, the photoresist layer 110 may fill the first trench 108. The photoresist layer 110 may then be patterned such that one or more portions of the surface of the dielectric layer 109 are exposed. The exposed portions of the dielectric layer 109 may be etched until the secondary etch stop layer 143 is reached to form one or more second trenches 108S. In various embodiments, the second trenches 108S are shallower than the first trench 108. In various embodiments, the depth of the second trenches 108S may be in the range of 0.50-0.95 times the depth of the first trench 108, such as 0.7-0.9 times the depth of the first trench 108. The second trenches 108S may have a width in the range of 0.12-0.2 μm, such as 0.14-0.18 μm, although wider or narrower trenches may be formed. Similar to the first trenches 108, the sidewalls of the second trenches 108S may slope inwardly such that the bottom of the second trenches 108S are narrower than the top of the second trenches 108S. Etching may be performed by wet etching or dry etching.

Figure 22D:
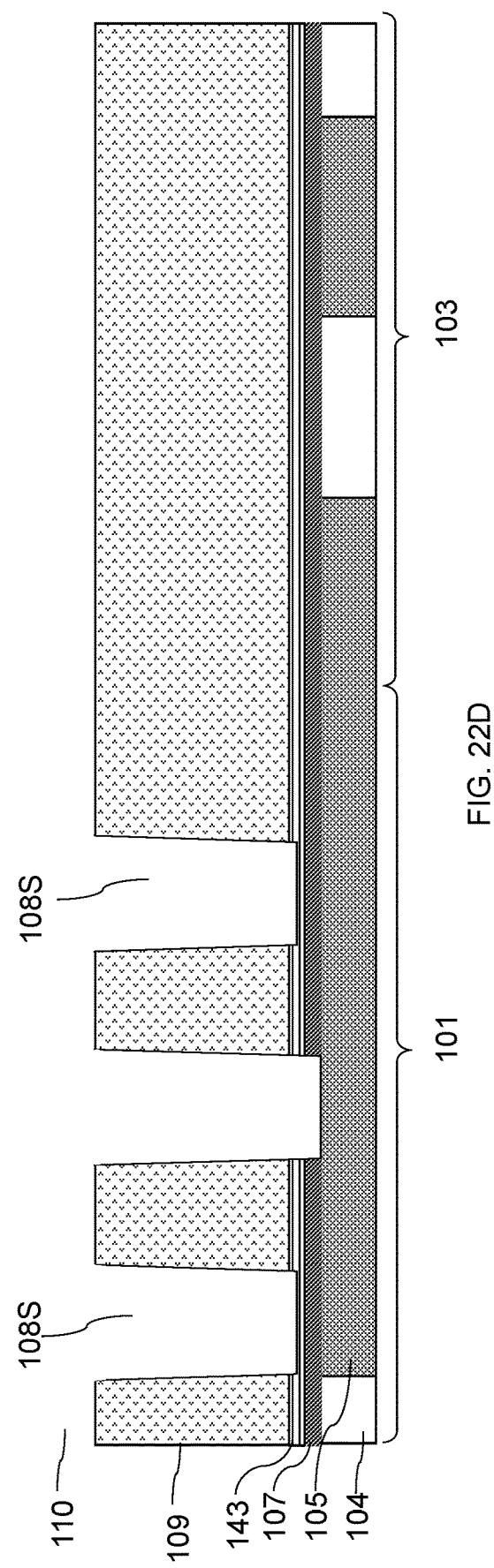
FIG. 22D is a vertical cross-sectional view illustrating removing photoresist from the intermediate structure illustrated in FIG. 22C according to an another embodiment of the present disclosure.

Referring to FIG. 22D, the photoresist layer 110 may be removed by ashing or dissolving in a solvent. An additional etch process may be performed to remove the first etch stop layer 107 that may be exposed at the bottom of first trench 108.

Figure 22E:
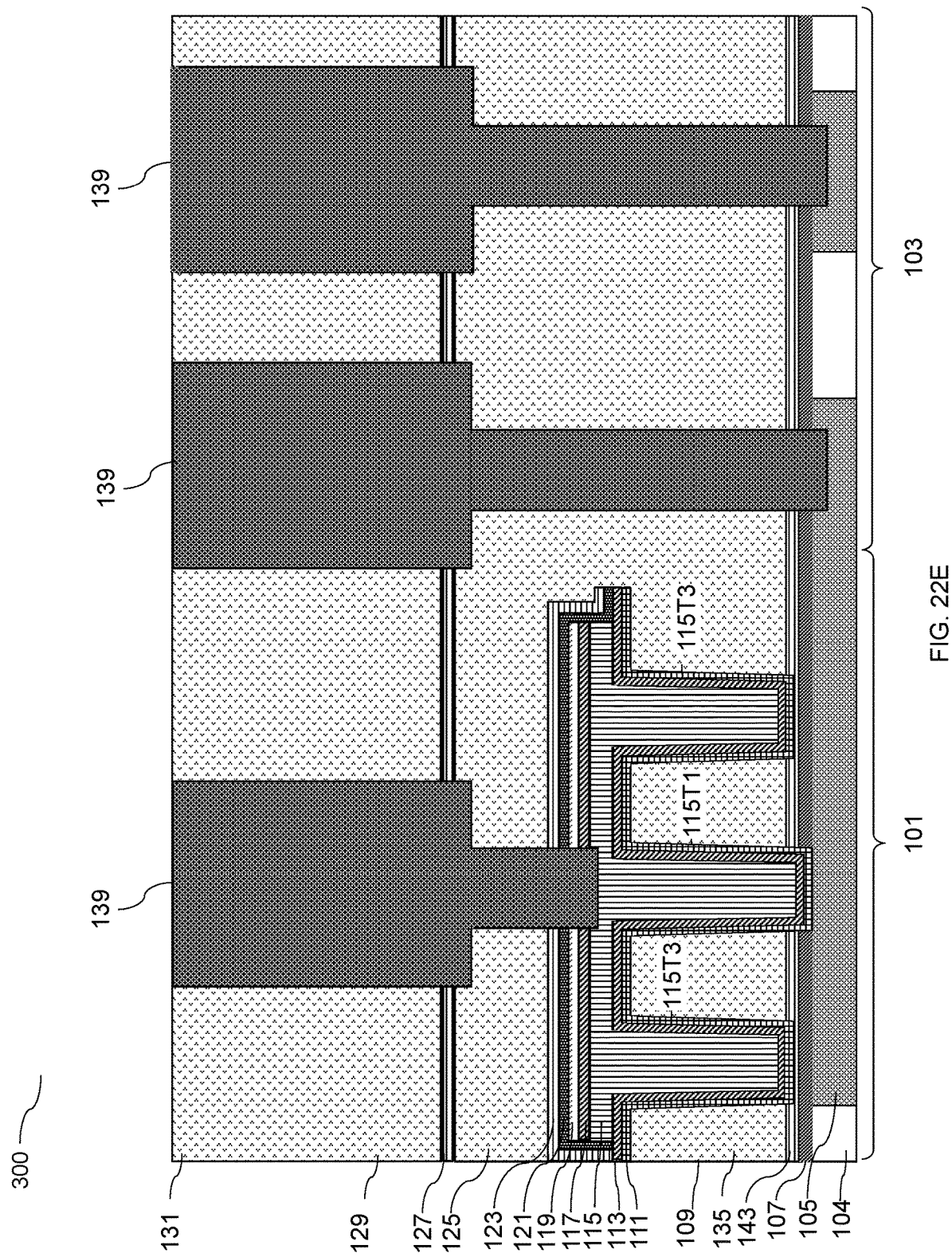
FIG. 22E is a vertical cross-sectional view illustrating a MIM capacitor having a second etch stop layer formed on the first etch stop layer and deeper second trenches according to another embodiment of the present disclosure.

Referring to FIG. 22E, the processing steps described above with reference to FIGS. 5-18 may be performed on the intermediate structure illustrated in FIG. 22D to provide the integrated semiconductor device 300 illustrated in FIG. 22E. As noted above, the integrated semiconductor device 300 illustrated in FIG. 22E includes a secondary etch stop layer 143 located on top of the first etch stop layer 107. Further, in this embodiment, the secondary tines 115T3 may be longer relative to the tines 115T2 illustrated in FIG. 21E. In this embodiment, the secondary tines 115T3 may be in the range of 0.5-0.95×, such as 0.7-0.9× of the length of the first tines 115T1. By adjusting the relative height of the first tine 115T1 and second tines 115T2 (115T3), the effective capacitance of the capacitor structure may be tuned (adjusted).

Figure 23:
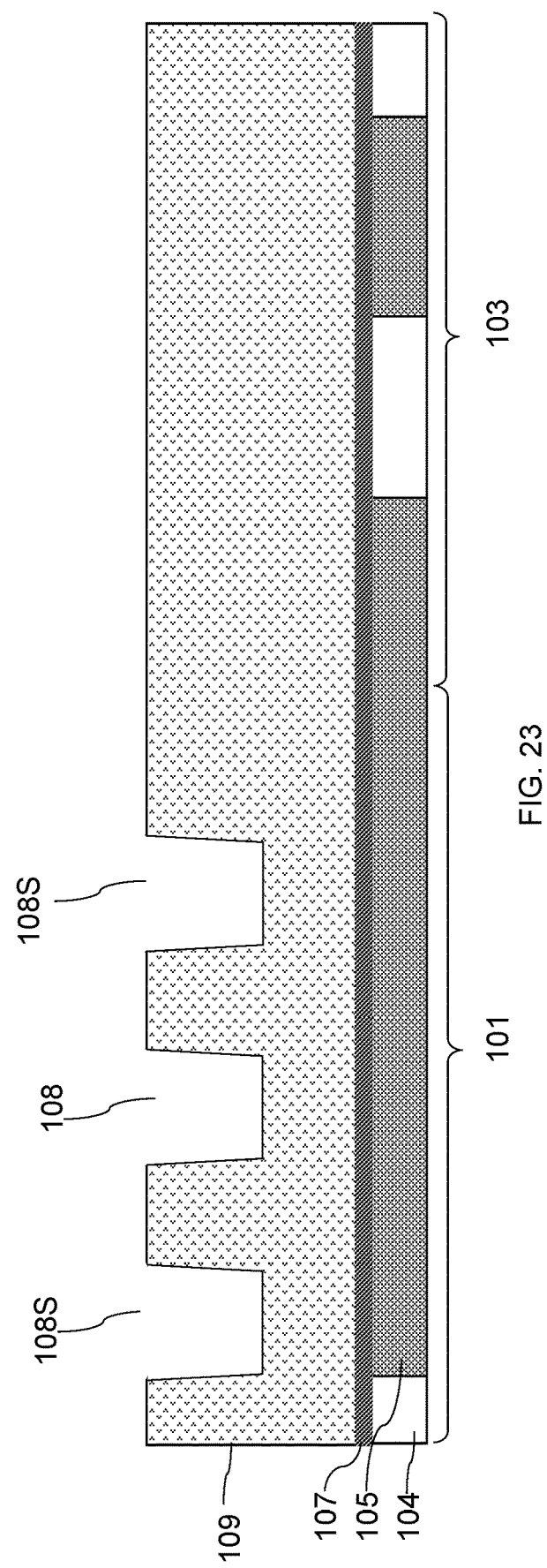
FIG. 23 is a vertical cross-sectional view illustrating a step of forming a first trench and second trenches in the dielectric layer according to another method embodiment of the present disclosure.

Referring to FIGS. 23-29, alternative method of forming MIM capacitors are illustrated. Referring to FIG. 23, a first etching step is performed to form the first trench 108 and the second trenches 108S. This may be accomplished by forming and patterning a photoresist layer (not shown) over the surface of the dielectric layer 109 and etching. In the first etching step, the depth of the first trench 108 and the second trenches 108S are substantially the same.

Figure 24:
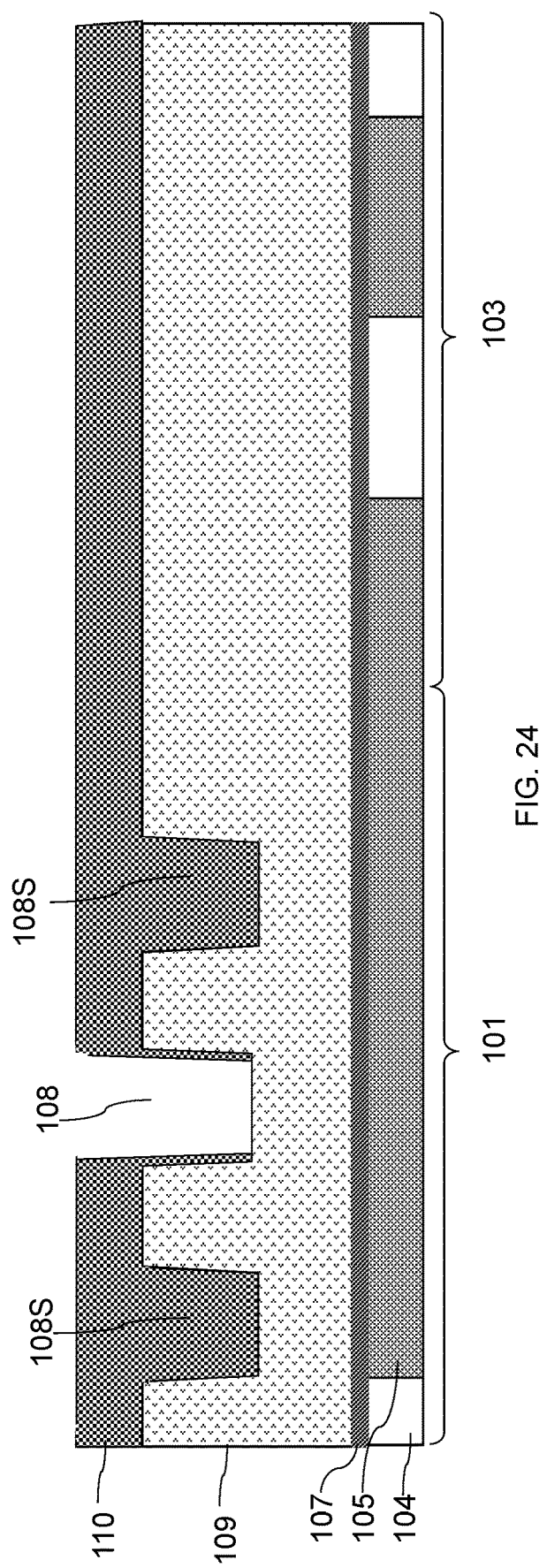
FIG. 24 is a vertical cross-sectional view illustrating forming a photoresist layer over the intermediate structure illustrated in FIG. 23 according to an embodiment of the present disclosure.

Referring to FIG. 24, a photoresist layer 110 may be deposited over the surface of the dielectric layer 109 and patterned. As illustrated in FIG. 24, in this embodiment, the second trenches 108S may be completely filled with photoresist, while a thin layer of photoresist material remains on the sidewalls of the first trench 108. The thickness of the photoresist layer 110 on the sidewalls of the first trench 108 may fill 2-10%, such as 4-6% of the first trench.

Figure 25:
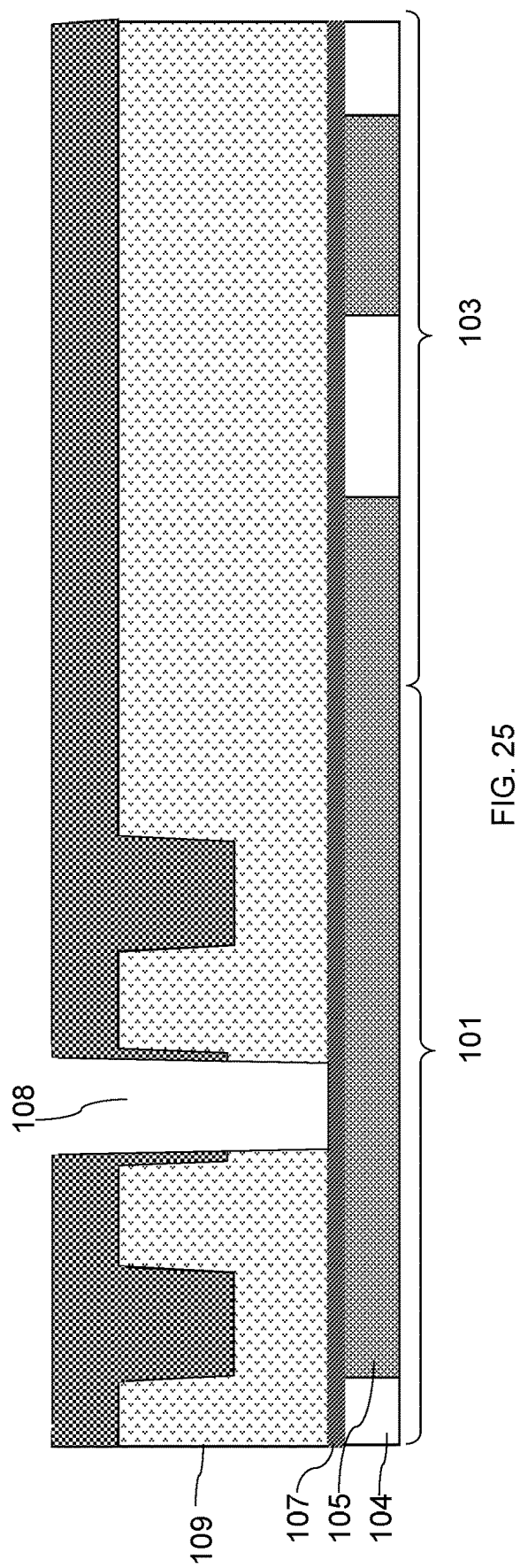
FIG. 25 is a vertical cross-sectional view illustrating of further etching the first trench to deepen the first trench according to an embodiment of the present disclosure.

Referring to FIG. 25, a second etching step may be performed to extend the bottom of the first trench 108 to the first etch stop layer 107. The second etching step may be performed by wet etching or dry etching.

Figure 26:
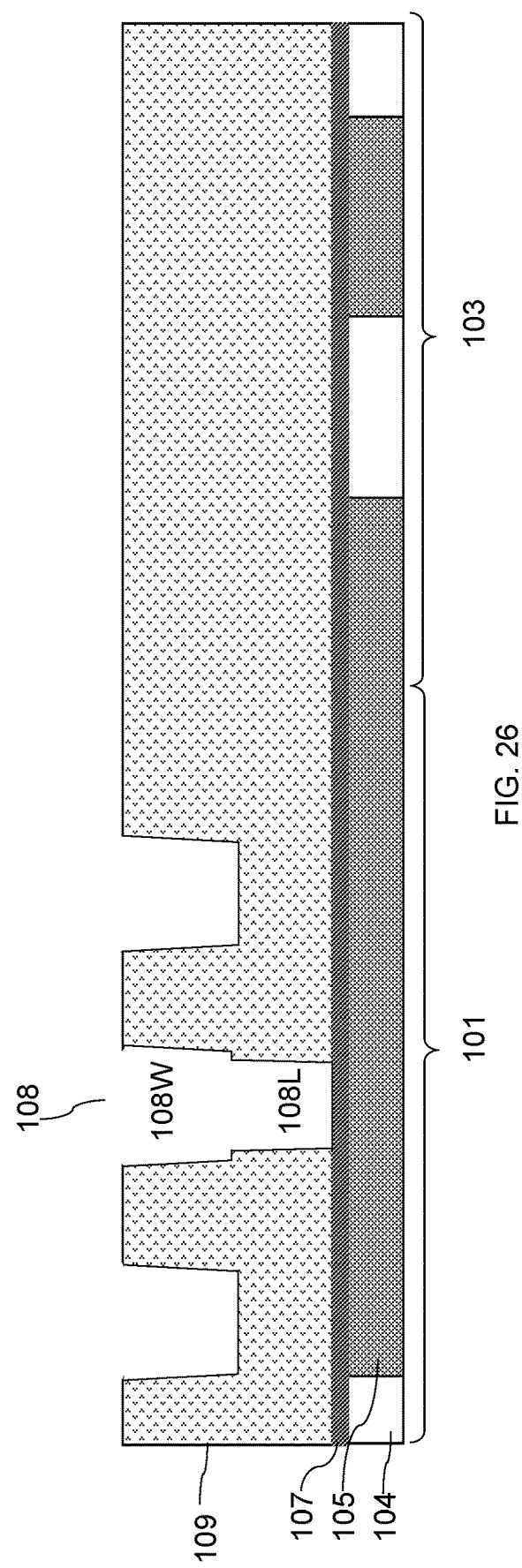
FIG. 26 is a vertical cross-sectional view illustrating removing photoresist material from an upper portion of the first trench to disclose a stair step structure in the trench according to an embodiment of the present disclosure.

Referring to FIG. 26, the photoresist layer 110 may be removed by ashing or dissolving with a solvent. As illustrated, the first trench 108 include an upper portion 108W and a lower portion 108L. The top of the lower portion 108L is narrower than the bottom of the upper portion 108W. That is, the sidewall of the first trench 108 in this embodiment includes a discontinuity which results in side walls with a stair step profile.

Figure 27:
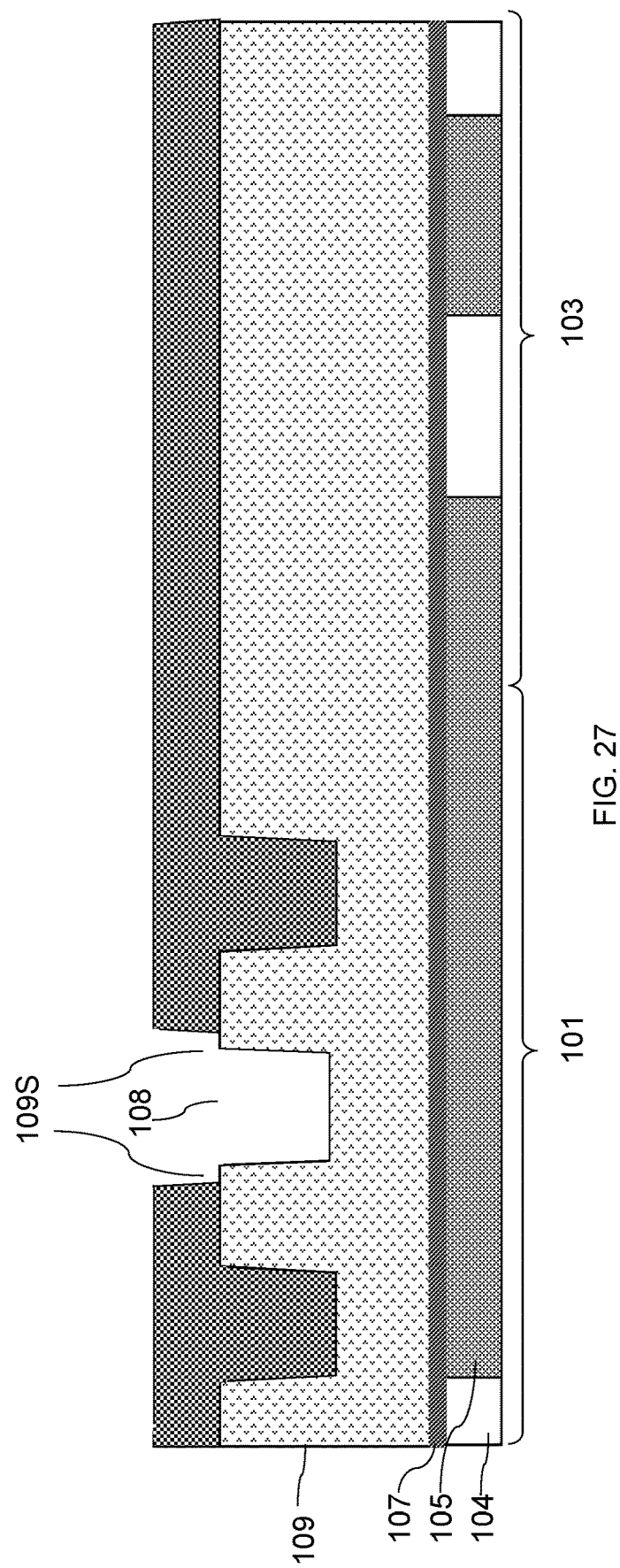
FIG. 27 is a vertical cross-sectional view illustrating a step of removing photoresist from a first trench according to another embodiment of the present disclosure.

Referring to FIG. 27, another embodiment method of making a MIM capacitor is illustrated. Specifically, FIG. 27 illustrates covering the surface of the dielectric layer 109 with a photoresist layer 110 and patterning the photoresist layer 110. In contrast to the previous embodiment, no photoresist material is left in the first trench 108 after performing the first etching step to form the first trench 108 and the second trenches 108S. Rather, a small portion 109S of the surface of the dielectric layer 109 aside the first trench 108 is exposed.

Figure 28:
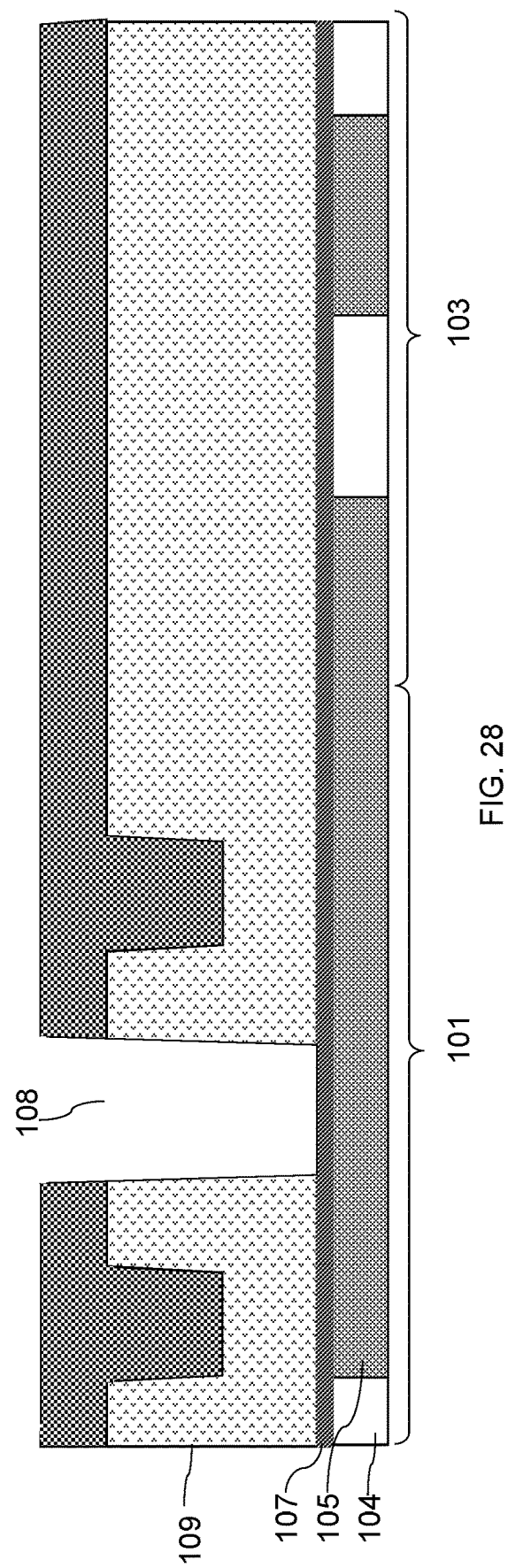
FIG. 28 is a vertical cross-sectional view illustrating a step of deepening the first trench of the intermediate structure illustrated in FIG. 27 according to an embodiment of the present disclosure.

Referring to FIG. 28, a second etching step may be performed. The second etching step extends the depth of the first trench 108 to the first etch stop layer 107. In contrast to the previous embodiment, the sidewalls of the first trench 108 are continuous. That is, the sidewalls of the first trench 108 do not have a discontinuity.

Figure 29:
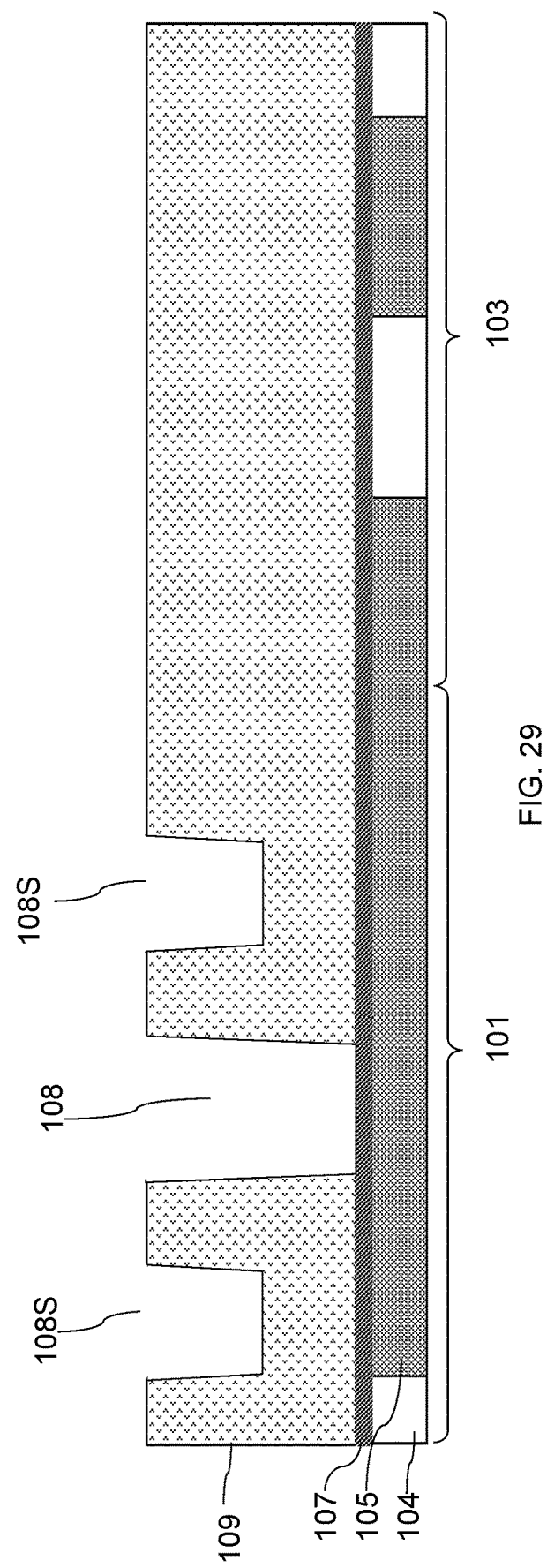
FIG. 29 is a vertical cross-sectional view illustrating removing the remaining photoresist from the intermediate structure illustrated in FIG. 28 according to an embodiment of the present disclosure.

Referring to FIG. 29, the photoresist layer 110 may be removed. As discussed in regards to FIG. 28, the sidewalls of the first trench are continuous and therefore do not have a stair step profile.

Figure 30:
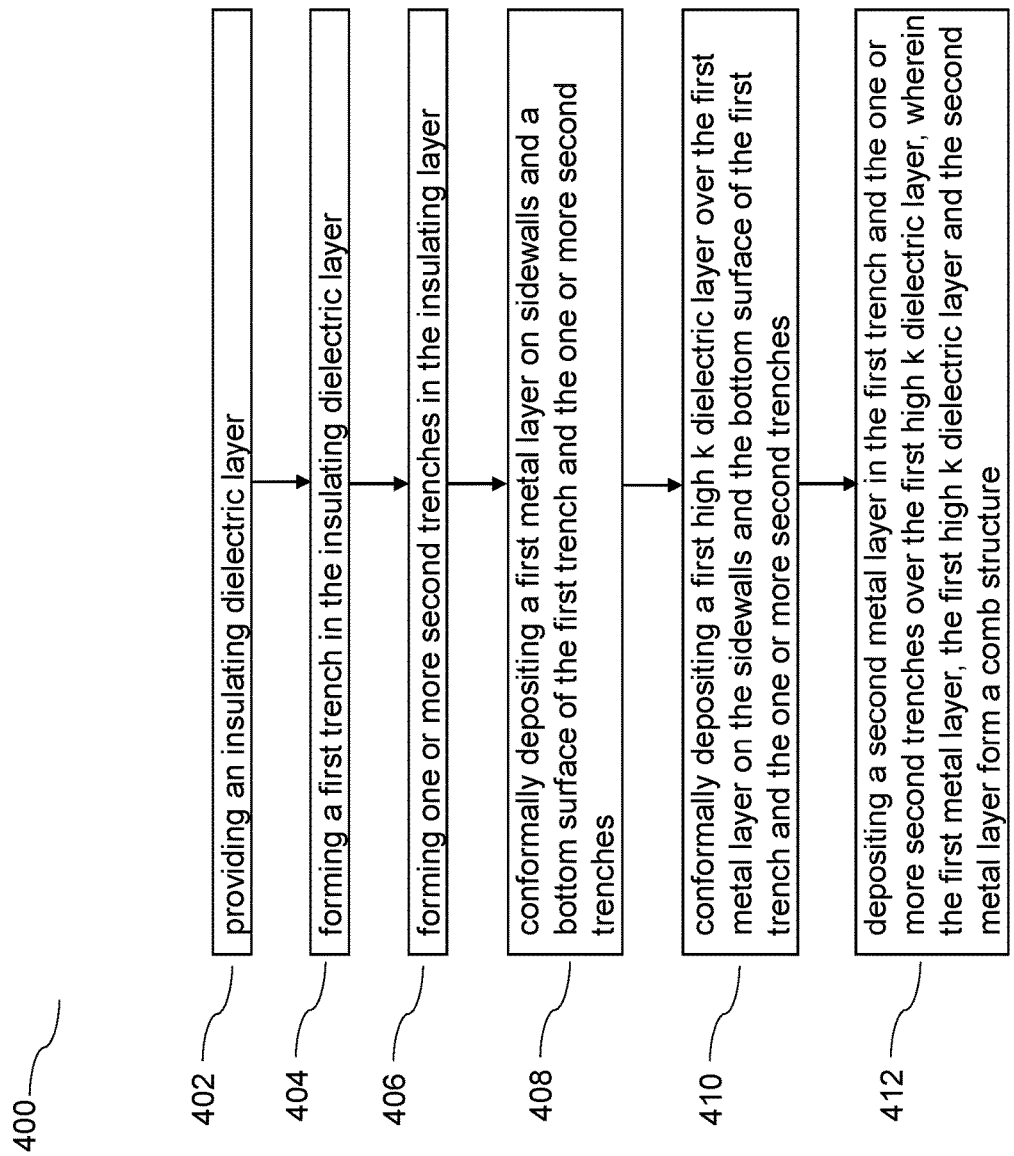
FIG. 30 is a flowchart that illustrates the general processing steps of the methods of the present disclosure.

FIG. 30 illustrates a general method 400 of making an integrated semiconductor device 100A, 100B, 100C, 200, 300. Referring to FIG. 30, the method 400 includes a step 402 of providing an insulating dielectric layer 109. Referring to step 404, the method 400 includes, forming a first trench 108 in the dielectric layer 109. Referring to step 406, the method 400 includes forming one or more secondary trenches 108S in the insulating dielectric layer 109. Referring to step 408, the method 400 includes, conformally depositing a first metal layer 111 on sidewalls and a bottom surface of the first trench 108 and the one or more second trenches 108S. Referring to step 410, the method 400 includes, conformally depositing a first high k dielectric layer 113 over the first metal layer 111 on the sidewalls and the bottom surface of the first trench 108 and the one or more second trenches 108S. Referring to step 412, the method 400 includes, depositing a second metal layer 115 in the first trench 108 and the one or more second trenches 108S over the first high k dielectric layer 113, wherein the first metal layer 111, the first high k dielectric layer 113 and the second metal layer 115 are formed in a comb structure, wherein the comb structure comprises a first tine structure and at least one second tine structure.

The present disclosure is directed to semiconductor devices, and specifically to semiconductor devices with metal-insulator-metal (MIM) capacitors. MIM capacitors offer the advantage of a relatively constant value of capacitance over a relatively wide range of voltages applied thereto. MIM capacitors also exhibit a relatively small parasitic resistance. In integrated circuit designs, on-chip capacitors may be used in various applications including dynamic random access memories (DRAM), voltage controlled oscillators (VCO), phase-lock loops, operational amplifiers and other circuit designs. Increase in the capacitance of a capacitor may improve the performance of capacitive devices. The various embodiments disclosed herein provide a MIM capacitor with a comb structure. The various embodiments provide a capacitor structure that effectively increases the area of the metal plates of the capacitor, while minimizing the footprint of the capacitor. The various embodiment capacitor are effectively a three dimensional (3D) capacitor in which the metal plates may vary in area by leveraging a lengthening in both a horizontal and vertical direction. Consequently, the various embodiment capacitors may possess a higher capacitance without reducing the areal density of the capacitors. In some embodiments, capacitance may be increased 1.1× (times) to 3× (times) the capacitance of conventional parallel plate capacitors formed in the same footprint using the same materials. Further, the capacitance may be tuned by adjusting the number of tines and the height of the tines.

Embodiments disclosed herein are directed to metal-insulator-metal (MIM) capacitor including a first metal layer 111, a second metal layer 115 and a dielectric layer 113 located between the second metal layer 115 and the first metal layer 111. The first metal layer 111, the second metal layer 115 and the dielectric layer 113 comprise a comb structure wherein the comb structure comprises a first tine structure of a first length; and at least one second tine structure of a second length, wherein the first length is longer than the second length.

Other embodiments are drawn to an integrated semiconductor device 100A-100C, 200, 300 including a first region 101 comprising a plurality of metal-insulator-metal (MIM) capacitors, the MIM capacitors including a first metal layer 111, a second metal layer 115 and a dielectric layer 113 located between the second metal layer 115 and the first metal layer 111. The first metal layer 111, the second metal layer 115 and the dielectric layer 113, are formed in a comb structure, wherein the comb structure comprises a first tine structure and at least one second tine structure. The integrated semiconductor device also includes a second region comprising logic circuits.

Other embodiments are drawn to a method of making a metal-insulator-metal (MIM) capacitor including providing an dielectric layer 109, forming a first trench 108 in the dielectric layer 109, forming one or more second trenches 108S in the dielectric layer 109, conformally depositing a first metal layer 111 on sidewalls and a bottom surface of the first trench 108 and the one or more second trenches 108S, conformally depositing a first high k dielectric layer 113 over the first metal layer 111 on the sidewalls and the bottom surface of the first trench 108 and the one or more second trenches 108S and depositing a second metal layer 115 in the first trench 108 and the one or more second trenches 108S over the first high k dielectric layer 113. The first metal layer 111, the first high k dielectric layer 113 and the second metal layer 115 form a comb structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor comprising:
a first metal layer;
a second metal layer;
a dielectric layer located between the second metal layer and the first metal layer;
a first contact via structure electrically connected to the second metal layer and comprising a first top surface above the MIM capacitor;
a second contact via electrically connected to a metal line located below the MIM capacitor and comprising a second top surface above the MIM capacitor; and
a first etch stop layer and a second etch stop layer, wherein the second etch stop layer is located at greater distance from a substrate than the first etch stop layer,
wherein the first metal layer, the second metal layer and the dielectric layer are formed in a comb structure, wherein the comb structure comprises:
a first tine structure of a first length; and
at least one second tine structure of a second length, wherein the first length is longer than the second length, and
wherein the first tine structure of the comb structure extends to the first etch stop layer and the at least one second tine structure of the comb structure extends to the second etch stop layer.

2. The capacitor of claim 1, wherein the second length is at least 0.25 times the first length.

3. The capacitor of claim 1, wherein the second etch stop layer comprises a secondary etch stop layer located directly on the first etch stop layer and the at least one second tine structure extends into the second etch stop layer.

4. The capacitor of claim 1, wherein the second length is at least 0.5 times the first length.

5. The capacitor of claim 4, wherein the first tine includes a stair step profile.

6. The capacitor of claim 1, further comprising:
a second dielectric layer formed over the second metal layer;
a first blocking layer formed over the second dielectric layer;
a third dielectric layer formed over the first blocking layer; and
a second blocking layer formed over the third dielectric layer.

7. An integrated semiconductor device comprising:
a first region comprising a plurality of metal-insulator-metal (MIM) capacitors, the MIM capacitors comprising:

a first metal layer;
a second metal layer;
a dielectric layer located between the second metal layer and the first metal layer;
a first contact via structure electrically connected to the second metal layer and comprising a first top surface above the MIM capacitor;
a second contact via electrically connected to a metal line located below the MIM capacitor and comprising a second top surface above the MIM capacitor; and
a first etch stop layer and a second etch stop layer, wherein the second etch stop layer is located at greater distance from a substrate than the first etch stop layer,
wherein the first metal layer, the second metal layer and the dielectric layer are formed in a comb structure, wherein the comb structure comprises a first tine structure and at least one second tine structure, and
wherein a first tine of the comb structure extends to the first etch stop layer and the at least one second tine structure of the comb structure extends to the second etch stop layer; and
a second region comprising logic circuits.

8. The integrated semiconductor device of claim 7, wherein the integrated semiconductor device may be formed in a back-end-of-line (BEOL) portion over a metal line embedded within an interlayer dielectric level (IDL) layer.

9. The integrated semiconductor device of claim 8, wherein the integrated semiconductor device is a CIS global shutter.

10. The integrated semiconductor device of claim 7, further comprising an interposer.

11. A method of making a metal-insulator-metal (MIM) capacitor comprising:
providing a dielectric layer;
forming a first trench in the dielectric layer;
forming one or more second trenches in the dielectric layer;
conformally depositing a first metal layer on sidewalls and a bottom surface of the first trench and the one or more second trenches;
conformally depositing a first high k dielectric layer over the first metal layer on the sidewalls and the bottom surface of the first trench and the one or more second trenches;
depositing a second metal layer in the first trench and the one or more second trenches over the first high k dielectric layer;
depositing a second dielectric layer over the second metal layer, a first blocking layer over the second dielectric layer, a third dielectric layer over the first blocking layer, and a second blocking layer over the third dielectric layer;
forming a first contact via structure that is electrically connected to the second metal layer and comprising a first top surface above the MIM capacitor; and
forming a second contact via that is electrically connected to a metal line located below the MIM capacitor and comprising a second top surface above the MIM capacitor,
wherein the first metal layer, the first high k dielectric layer and the second metal layer are formed in a comb structure, wherein the comb structure comprises a first tine structure formed in the first trench and at least one second tine structure formed in the one or more second trenches.

12. The method of claim 11, further comprising conformally depositing at least one metal barrier layer on sidewalls and a bottom surface of the first trench and the one or more second trenches prior to conformally depositing the first high k dielectric layer.

13. The method of claim 11, further comprising:
patterning the second blocking layer, the third dielectric layer, the first blocking layer and the second dielectric layer;
depositing an oxide layer over the patterned second blocking layer, the patterned third dielectric layer, the patterned first blocking layer and the patterned second dielectric layer;
planarizing the oxide layer; and
forming a contact via structure to the MIM capacitor.

14. The method of claim 11, wherein providing an dielectric layer comprises:
forming a first etch stop layer;
forming a first dielectric layer over the first etch stop layer;
forming a second etch stop layer over the first dielectric layer;
forming a second dielectric layer over the second etch stop layer; and
forming a third dielectric layer over the second etch stop layer.

15. The method of claim 14, wherein forming the one or more second trenches in the dielectric layer; comprises etching through the third dielectric layer and stopping at the second etch stop layer.

16. The method of claim 11, wherein providing a dielectric layer comprises:
forming a first etch stop layer;
forming a second etch stop layer over the first etch stop layer, the second etch stop layer comprising a different material from the first etch stop layer; and
forming the dielectric layer over the second etch stop layer.

17. The method of claim 16, wherein
forming a first trench in the dielectric layer comprises etching through the dielectric layer, the second etch stop layer and the first etch stop layer; and
forming the one or more second trenches in the dielectric layer comprises etching through the dielectric layer and stopping etching in the second etch stop layer.

18. The method of claim 11, wherein forming the first trench in the dielectric layer comprises a first etching step followed by a second etching step resulting in the first trench comprising a stair step profile.

19. The method of claim 11, wherein forming the first trench in the dielectric layer and forming the one or more second trenches in the dielectric layer comprises:
a first etching step partially forming the first trench and forming the one or more second trenches;
filling the one or more second trenches with a photoresist layer; and
etching the partially formed first trench to complete the first trench.

20. The method of claim 11, further comprising:
forming a passivation layer over the first blocking layer; and
forming a capacitor etch stop layer over the passivation layer.

* * * * *